(12) United States Patent
You et al.

(10) Patent No.: US 12,199,040 B2
(45) Date of Patent: Jan. 14, 2025

(54) SEMICONDUCTOR DEVICE

(71) Applicant: Samsung Electronics Co., Ltd., Suwon-si (KR)

(72) Inventors: Hyeongyu You, Hwaseong-si (KR); Jisu Yu, Seoul (KR); Jae-Woo Seo, Seoul (KR); Seung Man Lim, Siheung-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 777 days.

(21) Appl. No.: 17/180,491

(22) Filed: Feb. 19, 2021

(65) Prior Publication Data

US 2022/0020691 A1 Jan. 20, 2022

(30) Foreign Application Priority Data

Jul. 14, 2020 (KR) .................. 10-2020-0086654

(51) Int. Cl.
*H01L 23/528* (2006.01)
*H01L 21/285* (2006.01)
(Continued)

(52) U.S. Cl.
CPC .... *H01L 23/5286* (2013.01); *H01L 21/28518* (2013.01); *H01L 21/823814* (2013.01);
(Continued)

(58) Field of Classification Search
CPC ............ H01L 27/0207; H01L 27/0924; H01L 27/092; H01L 23/5286; H01L 29/0673; H01L 29/0847; H01L 29/41733; H01L 29/41791; H01L 29/7851; H01L 29/78618; H01L 29/78696
See application file for complete search history.

(56) References Cited

U.S. PATENT DOCUMENTS 6,849,906 B2  2/2005  Maeno et al.
7,299,440 B2  11/2007  Yoshida et al.
(Continued)

FOREIGN PATENT DOCUMENTS

JP    2018151977 A    9/2018
KR   1020180101698 A   9/2018
(Continued)

*Primary Examiner* — Jaehwan Oh
*Assistant Examiner* — John M Parker
(74) *Attorney, Agent, or Firm* — Muir Patent Law, PLLC

(57) ABSTRACT

Disclosed is a semiconductor device comprising a first logic cell and a second logic cell on a substrate. Each of the first and second logic cells includes a first active region and a second active region that are adjacent to each other in a first direction, a gate electrode that runs across the first and second active regions and extends lengthwise in the first direction, and a first metal layer on the gate electrode. The first metal layer includes a first power line and a second power line that extend lengthwise in a second direction perpendicular to the first direction, and are parallel to each other. The first and second logic cells are adjacent to each other in the second direction along the first and second power lines. The first and second active regions extend lengthwise in the second direction from the first logic cell to the second logic cell.

20 Claims, 41 Drawing Sheets

(51) Int. Cl.
*H01L 21/8238* (2006.01)
*H01L 27/092* (2006.01)
*H01L 29/06* (2006.01)
*H01L 29/08* (2006.01)
*H01L 29/417* (2006.01)
*H01L 29/423* (2006.01)
*H01L 29/45* (2006.01)
*H01L 29/66* (2006.01)
*H01L 29/78* (2006.01)
*H01L 29/786* (2006.01)

(52) U.S. Cl.
CPC ......... *H01L 21/823821* (2013.01); *H01L 21/823828* (2013.01); *H01L 21/823871* (2013.01); *H01L 27/0924* (2013.01); *H01L 29/0673* (2013.01); *H01L 29/0847* (2013.01); *H01L 29/41733* (2013.01); *H01L 29/41791* (2013.01); *H01L 29/42392* (2013.01); *H01L 29/45* (2013.01); *H01L 29/66545* (2013.01); *H01L 29/7851* (2013.01); *H01L 29/78618* (2013.01); *H01L 29/78696* (2013.01)

(56) References Cited

U.S. PATENT DOCUMENTS

| | | |
|---|---|---|
| 7,302,660 B2 | 11/2007 | Shimamura |
| 7,800,409 B2 | 9/2010 | Pitts |
| 8,631,377 B2 | 1/2014 | Lee et al. |
| 10,268,793 B2 | 4/2019 | Lee et al. |
| 10,756,114 B2 | 8/2020 | Liaw |
| 10,815,205 B2 | 10/2020 | Collin-Kröpelin et al. |
| 10,916,535 B2 | 2/2021 | Do et al. |
| 10,957,765 B2 | 3/2021 | Park et al. |
| 2006/0186478 A1 | 8/2006 | Hughes et al. |
| 2016/0254256 A1* | 9/2016 | Baek ............... H01L 23/5283 257/401 |
| 2017/0317100 A1* | 11/2017 | Kang ............... G06F 30/327 |
| 2017/0365594 A1* | 12/2017 | Yang ............... H01L 27/0207 |
| 2017/0371994 A1 | 12/2017 | Bowers et al. |
| 2019/0148407 A1 | 5/2019 | Guo et al. |
| 2020/0058681 A1 | 2/2020 | Lai et al. |
| 2020/0104446 A1 | 4/2020 | Li et al. |
| 2020/0161334 A1* | 5/2020 | Seo ............... H01L 27/0924 |

FOREIGN PATENT DOCUMENTS

| | | |
|---|---|---|
| KR | 1020180132492 A | 12/2018 |
| KR | 1020190087752 A | 7/2019 |
| TW | 200710925 A | 3/2007 |
| TW | 201806943 A | 3/2018 |
| TW | 201924058 A | 6/2019 |
| TW | 201931526 A | 8/2019 |

* cited by examiner

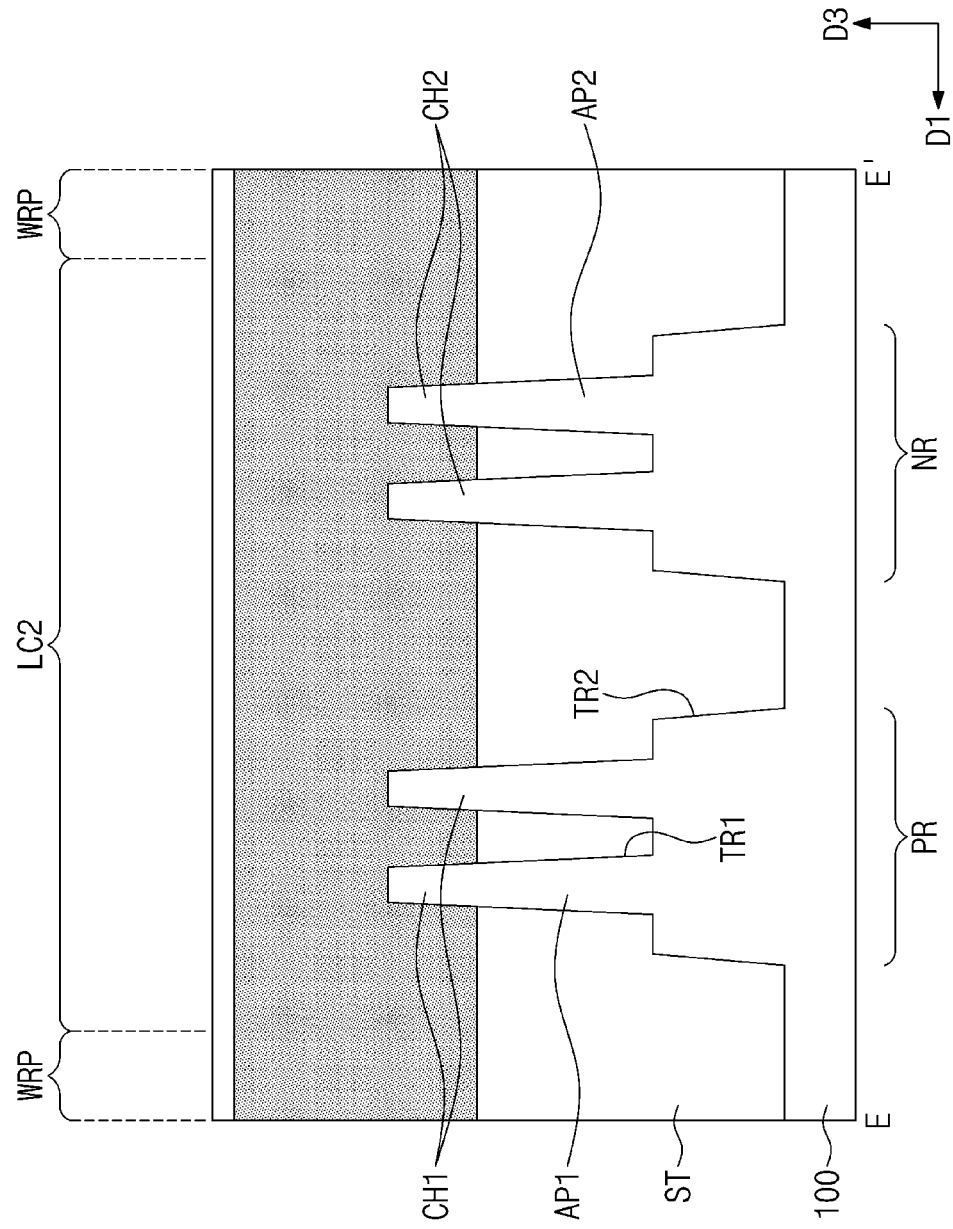

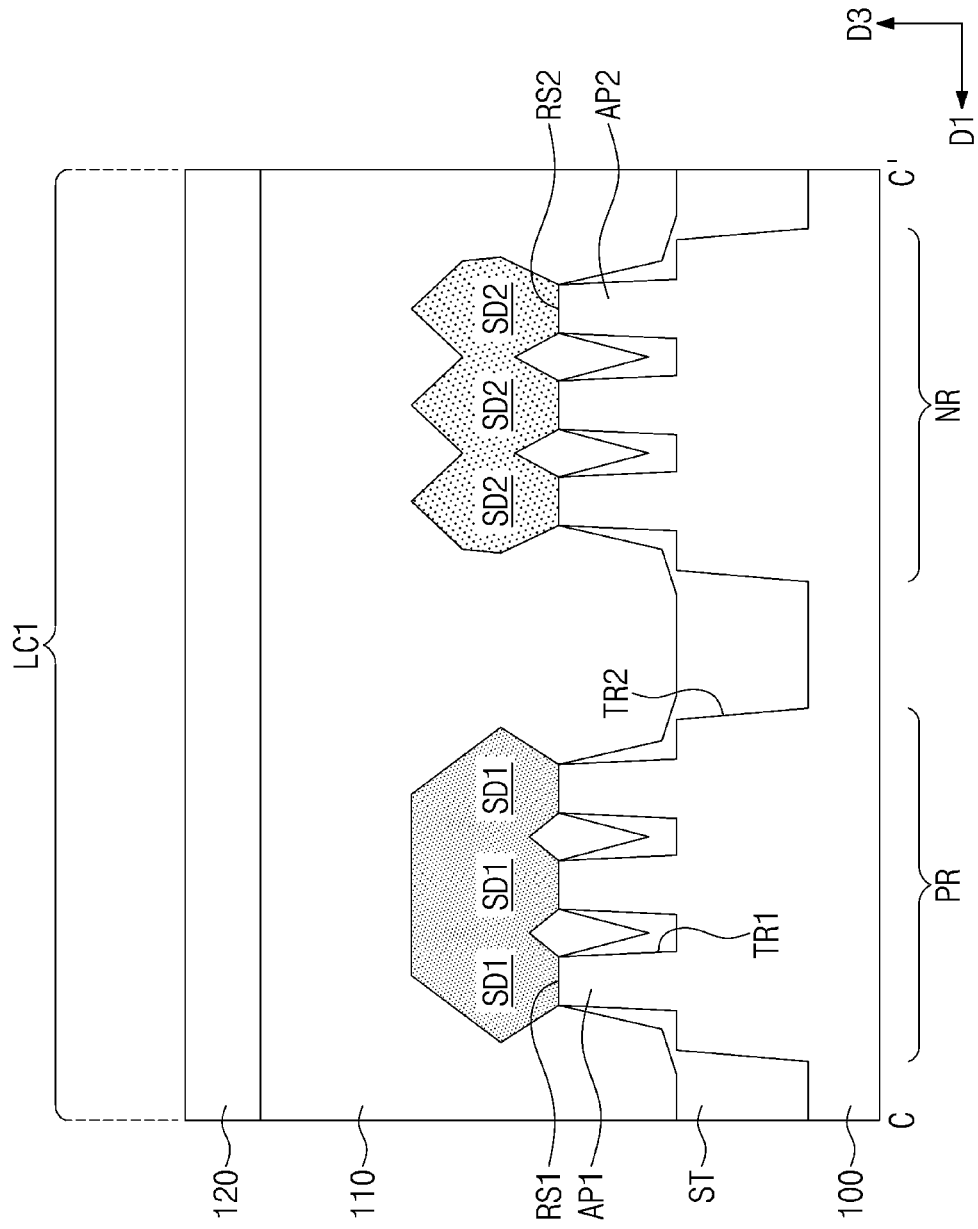

SEMICONDUCTOR DEVICE

CROSS-REFERENCE TO RELATED APPLICATION

This U.S. nonprovisional application claims priority under 35 U.S.C § 119 to Korean Patent Application No. 10-2020-0086654 filed on Jul. 14, 2020 in the Korean Intellectual Property Office, the disclosure of which is hereby incorporated by reference in its entirety.

BACKGROUND

The present inventive concepts relate to a semiconductor device, and more particularly, to a semiconductor device including a field effect transistor.

Semiconductor devices are beneficial in the electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly required for high integration with the advanced development of the electronic industry. For example, semiconductor devices have been increasingly requested for high reliability, high speed, and/or multi-functionality. Semiconductor devices are gradually complicated and integrated to meet these requested characteristics.

SUMMARY

Some example embodiments of the present inventive concepts provide a semiconductor device including field effect transistors whose integration and performance are improved.

According to some example embodiments of the present inventive concepts, a semiconductor device may comprise a first logic cell and a second logic cell on a substrate. Each of the first and second logic cells may include: a first active region and a second active region that are adjacent to each other in a first direction; a gate electrode that runs across the first and second active regions and extends lengthwise in the first direction; and a first metal layer on the gate electrode. The first metal layer may include a first power line and a second power line that extend lengthwise in a second direction perpendicular to the first direction, and are parallel to each other. The first and second logic cells may be adjacent to each other in the second direction along the first and second power lines. The first and second active regions may extend lengthwise in the second direction from the first logic cell to the second logic cell. The first metal layer of the first logic cell may further include one or more first lower lines aligned on first line tracks between the first and second power lines. The first metal layer of the second logic cell may further include one or more second lower lines aligned on second line tracks between the first and second power lines. The first and second line tracks may extend in the second direction. A distance between different sets of adjacent first line tracks of the first logic cell may be the same. A distance between different sets of adjacent second line tracks of the second logic cell may be the same. At least one of the first line tracks of the first logic cell may be disposed at a center in the first direction of the one or more first lower lines. At least one of the second line tracks of the second logic cell may be disposed at a center in the first direction of the one or more second lower lines. The second line tracks may be offset in the first direction from corresponding first line tracks.

According to some example embodiments of the present inventive concepts, a semiconductor device may comprise a first logic cell and a second logic cell on a substrate. Each of the first and second logic cells may include: a first active region and a second active region that are adjacent to each other in a first direction; a first active pattern and a second active pattern on the first active region and the second active region, respectively; a gate electrode that runs across the first and second active patterns and extends lengthwise in the first direction; and a first metal layer on the gate electrode. The first metal layer may include a first power line and a second power line that extend lengthwise in a second direction perpendicular to the first direction, and are parallel to each other. The first and second logic cells may be adjacent to each other in the second direction along the first and second power lines. The first and second active regions may extend in the second direction from the first logic cell to the second logic cell. The first active pattern of each of the first and second logic cells may include a plurality of first channel patterns that are vertically stacked and spaced apart from each other. An uppermost one of the first channel patterns on the first logic cell may have a first width in the first direction. An uppermost one of the first channel patterns on the second logic cell may have a second width in the first direction. The first width may be greater than the second width.

According to some example embodiments of the present inventive concepts, a semiconductor device may comprise a first logic cell and a second logic cell on a substrate. Each of the first and second logic cells may include: a first active region and a second active region that are adjacent to each other in a first direction; a plurality of first active fins on the first active region; a plurality of second active fins on the second active region; a gate electrode that runs across the first and second active fins and extends lengthwise in the first direction; and a first metal layer on the gate electrode. The first metal layer may include a first power line and a second power line that extend lengthwise in a second direction perpendicular to the first direction, and are parallel to each other. The first and second logic cells may be adjacent to each other in the second direction along the first and second power lines. The first and second active regions may extend in the second direction from the first logic cell to the second logic cell. The number of the first active fins on the first logic cell may be greater than the number of the first active fins on the second logic cell. A length in the first direction of the gate electrode on the first logic cell may be greater than a length in the first direction of the gate electrode on the second logic cell.

BRIEF DESCRIPTION OF THE DRAWINGS

FIGS. 5C, 7C, and 9C illustrate cross-sectional views taken along line C-C' of FIGS. 4, 6, and 8, respectively, according to example embodiments.

FIGS. 7E and 9E illustrate cross-sectional views taken along line E-E' of FIGS. 6 and 8, respectively, according to example embodiments.

DETAILED DESCRIPTION OF EMBODIMENTS

Figure 1:
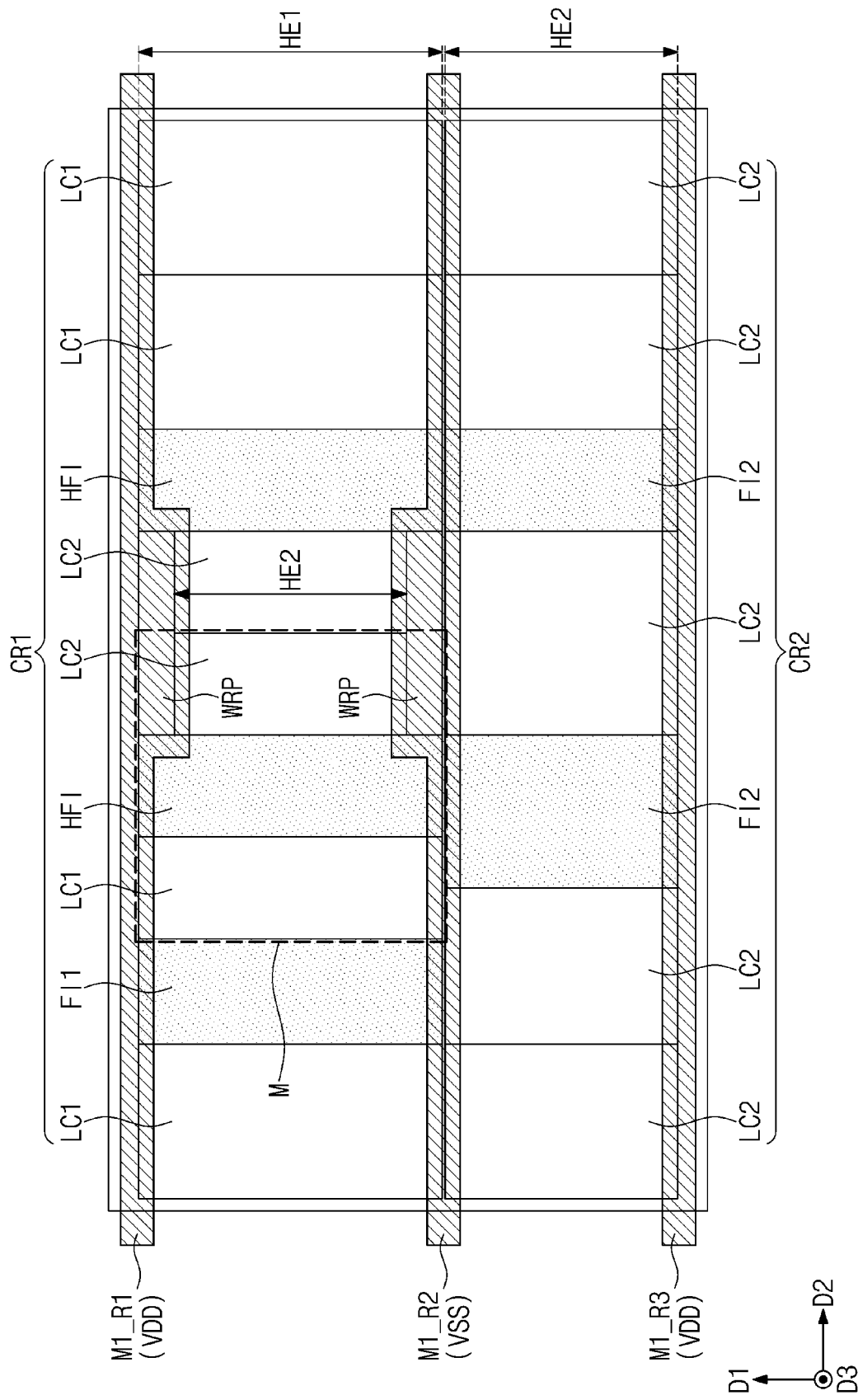
FIG. 1 illustrates a plan view showing a semiconductor device according to some example embodiments of the present inventive concepts.

FIG. 1 illustrates a plan view showing a semiconductor device according to some example embodiments of the present inventive concepts.

Referring to FIG. 1, a substrate 100 may be provided thereon with a first power line M1_R1, a second power line M1_R2, and a third power line M1_R3. For example, each of the first and third power lines M1_R1 and M1_R3 may be a pathway through which is provided a drain voltage VDD, for example, a power voltage. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other. The second power line M1_R2 may be a pathway through which is provided a source voltage VSS, for example, a ground voltage. The first, second, and third power lines M1_R1, M1_R2, and M1_R3 may extend lengthwise in a second direction D2 and may be parallel to each other. An item, layer, or portion of an item or layer described as extending "lengthwise" in a particular direction has a length in the particular direction and a width perpendicular to that direction, where the length is greater than the width.

A first cell block CR1 may be defined between the first and second power lines M1_R1 and M1_R2, and first logic cells LC1 may be disposed on the first cell block CR1. A second cell block CR2 may be defined between the second and third power lines M1_R2 and M1_R3, and second logic cells LC2 may be disposed on the second cell block CR2.

Each of the first and second logic cells LC1 and LC2 may mean a logic device or a logic circuit (e.g., AND, OR, XOR, XNOR, or Inverter) that performs a specific function. For example, each of the first and second logic cells LC1 and LC2 may include transistors for constituting a logic device, and also include wiring lines for connecting the transistors to each other.

Each of the first logic cells LC1 may have a first cell height HE1 in a first direction D1 perpendicular to the second direction D2. Each of the second logic cells LC2 may have a second cell height HE2 in the first direction D1. The first cell height HE1 may be greater than the second cell height HE2. For example, the first logic cell LC1 may be a standard cell defined to have a relatively large cell height, and the second logic cell LC2 may be a standard cell defined to have a relatively small cell height.

An interval between the first and second power lines M1_R1 and M1_R2 may be greater than an interval between the second and third power lines M1_R2 and M1_R3. A pitch between the first and second power lines M1_R1 and M1_R2 may be identical to the first cell height HE1, and a pitch between the second and third power lines M1_R2 and M1_R3 may be identical to the second cell height HE2.

The first cell block CR1 may be defined as the first cell height HE1 between the first and second power lines M1_R1 and M1_R2. Therefore, on the first cell block CR1, the first logic cells LC1 each having the first cell height HE1 may be disposed along the second direction D2. The second cell block CR2 may be defined as the second cell height HE2 between the second and third power lines M1_R2 and M1_R3. Therefore, on the second cell block CR2, the second logic cells LC2 each having the second cell height HE2 may be disposed along the second direction D2.

The first cell block CR1 may further include at least one first filler cell FI1 interposed between neighboring first logic cells LC1. The second cell block CR2 may further include at least one second filler cell FI2 interposed between neighboring second logic cells LC2. Each of the first and second filler cells FI1 and FI2 may be a dummy cell that fills a space between logic cells disposed in accordance with a designed circuit. For example, each of the first and second filler cells FI1 and FI2 may include at least one of an active pattern, a source/drain pattern, a metal layer, a gate electrode, an active contact, a gate contact, a separation structure, and a cutting pattern. For example, the first and second filler cells FI1 and FI2 may have no circuit function.

The first cell block CR1 may include at least one second logic cell LC2. As the second cell height HE2 of the second logic cell LC2 is less than the first cell height HE1 of the first cell block CR1, a wrapper WRP may be provided to compensate for a difference in height therebetween. For example, a pair of wrappers WRP may be placed on lateral surfaces of the second logic cell LC2 that face each other in the first direction D1.

The wrapper WRP may include a power line. In some example embodiments, the first power line M1_R1 may further extend lengthwise via the wrapper WRP toward the second logic cell LC2. For example, the first power line M1_R1 may have a width in the first direction D1 that increases as approaching the second logic cell LC2. Hereinafter, a width of each of the first, second, and third power lines M1_R1, M1_R2, and M1_R3 may be referred to as in the first direction D1. A portion of the first power line M1_R1 may be disposed in the second logic cell LC2 via the wrapper WRP.

The first cell block CR1 may further include a hybrid filler cell HFI interposed between the first and second logic cells LC1 and LC2 that are adjacent to each other. The hybrid filler cell HFI may be a buffer region that solves errors caused by a difference in design rule between the first logic cell LC1 and the second logic cell LC2. For example, the hybrid filler cell HFI may increase a width of the first power line M1_R1_. For another example, although not shown, the hybrid filler cell HFI may reduce a width of an active region.

In conclusion, to remove a difference in layer design between the first and second logic cells LC1 and LC2, the hybrid filler cell HFI may physically extend a layer, may physically shrink a layer, or may change the position of the layer. For example, the hybrid filler cell HFI may include at least one of an active pattern, a source/drain pattern, a metal layer, a gate electrode, an active contact, a gate contact, a separation structure, and a cutting pattern. In one example, the hybrid filler cell HFI may have no circuit function.

In some example embodiments, because the first logic cell LC1 has a cell height greater than that of the second logic cell LC2, a transistor in the first logic cell LC1 may have a channel size greater than that of a transistor in the second logic cell LC2. Accordingly, even though the first logic cell LC1 has a cell area greater than that of the second logic cell LC2, the first logic cell LC1 may operate at higher speeds than those of the second logic cell LC2.

In general, the first cell block CR1 may include only the first logic cells LC1 each having the first cell height HE1. A design rule may not allow the first cell block CR1 to include the second logic cell LC2 having the second cell height HE2 less than the first cell height HE1. The first logic cells LC1 may be selectively disposed on the first cell block CR1 only in a circuit that requires a high-speed operation, and thus a great deal of empty space may be present in the first cell block CR1. However, as discussed above, a design rule may not allow the second logic cell LC2 to occupy the empty space.

According to some example embodiments of the present inventive concepts, because of the wrapper WRP to enlarge a cell height of the second logic cell LC2, and because of the hybrid filler cell HFI to serve as a buffer region, the second logic cell LC2 may be disposed also on the first cell block CR1. Therefore, instead of the first filler cell FI1, at least one second logic cell LC2 may be disposed on the empty space present in the first cell block CR1. As a result, a semiconductor device may increase in integration.

Figure 2:
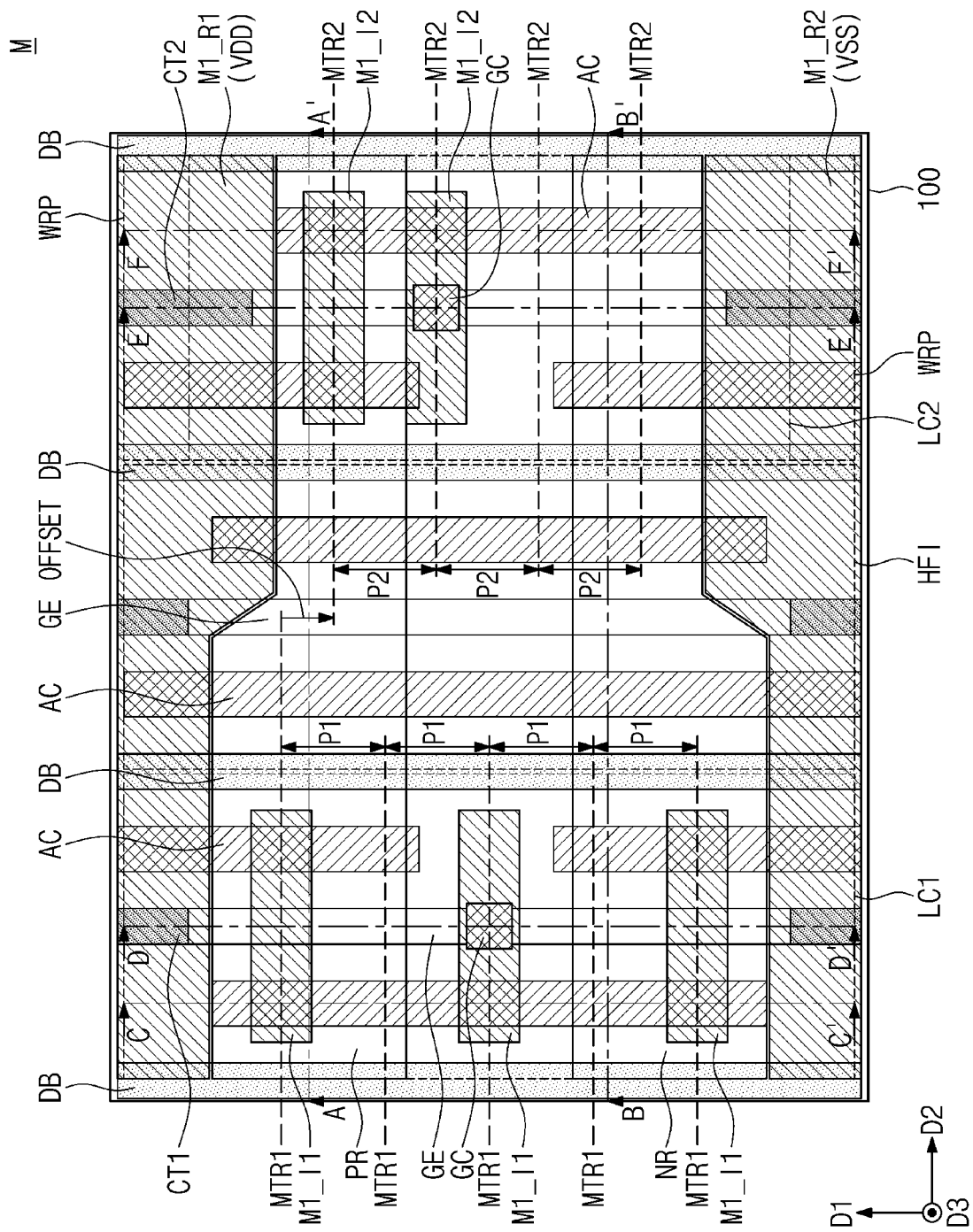
FIG. 2 illustrates a detailed plan view showing section M of FIG. 1 according to example embodiments.
Figure 3A:
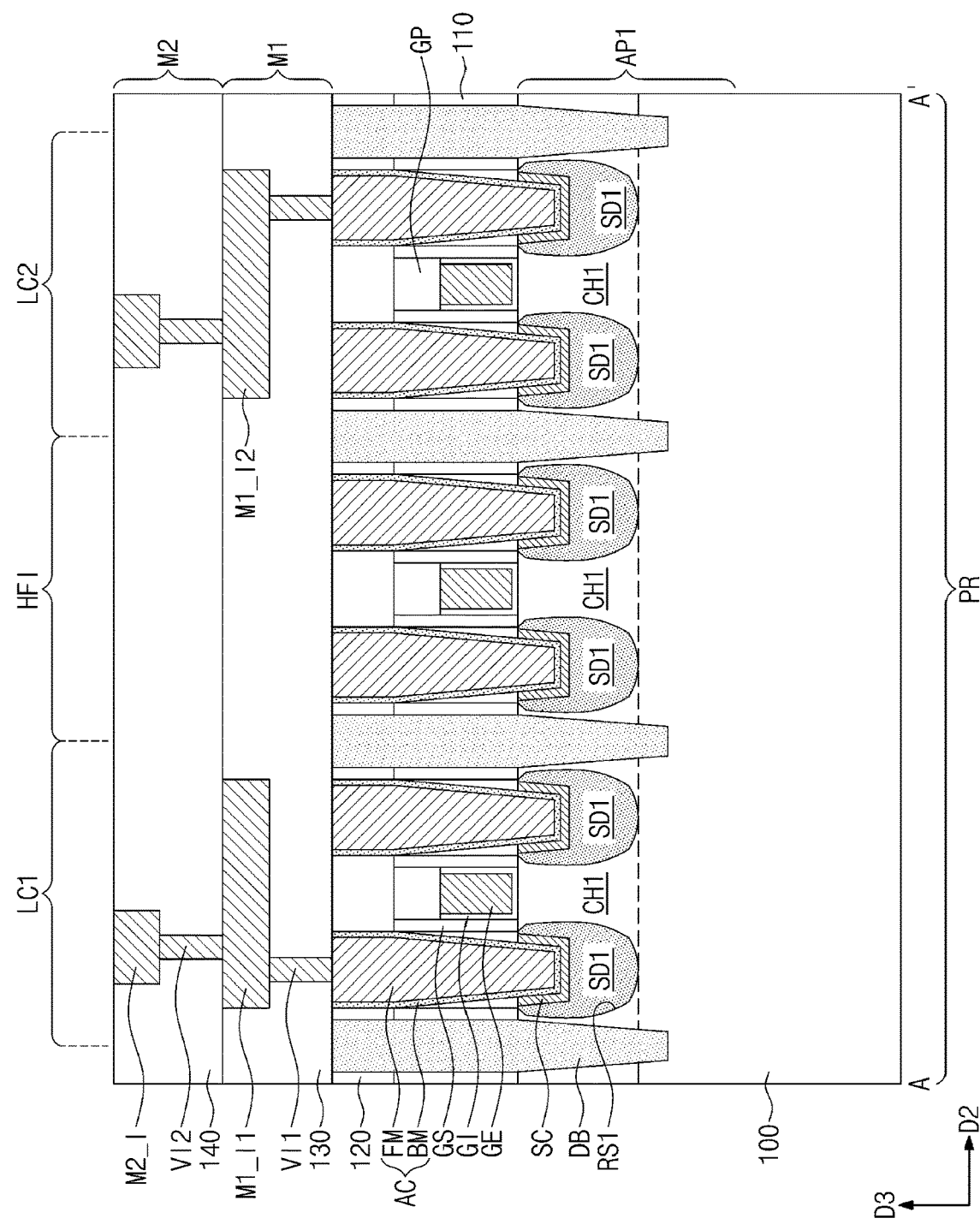
FIGS. 3A, 3B, 3C, 3D, 3E, and 3F illustrate cross-sectional views respectively taken along lines A-A', B-B', C-C', D-D', E-E', and F-F' of FIG. 2 according to example embodiments.
Figure 3B:
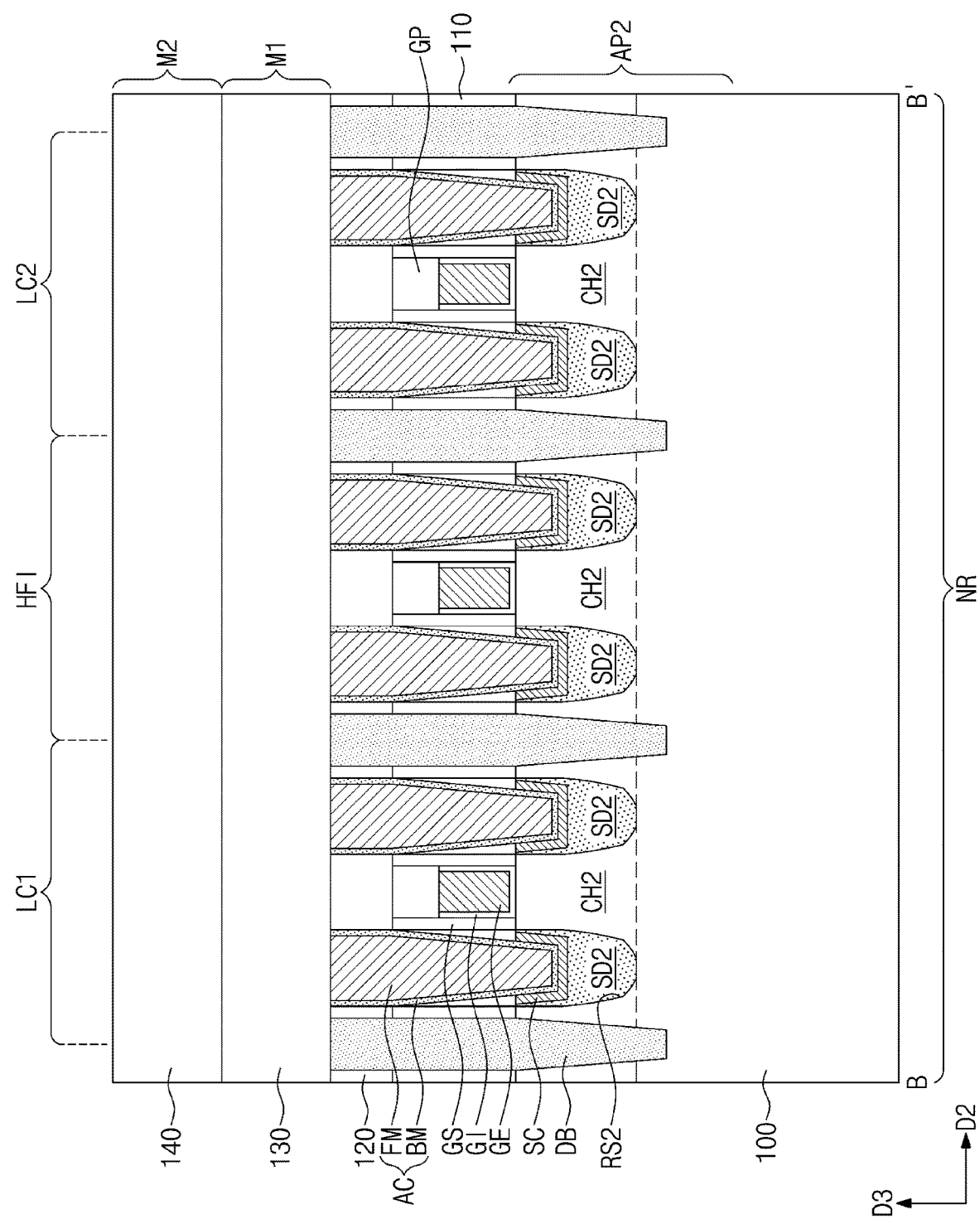
Figure 3C:
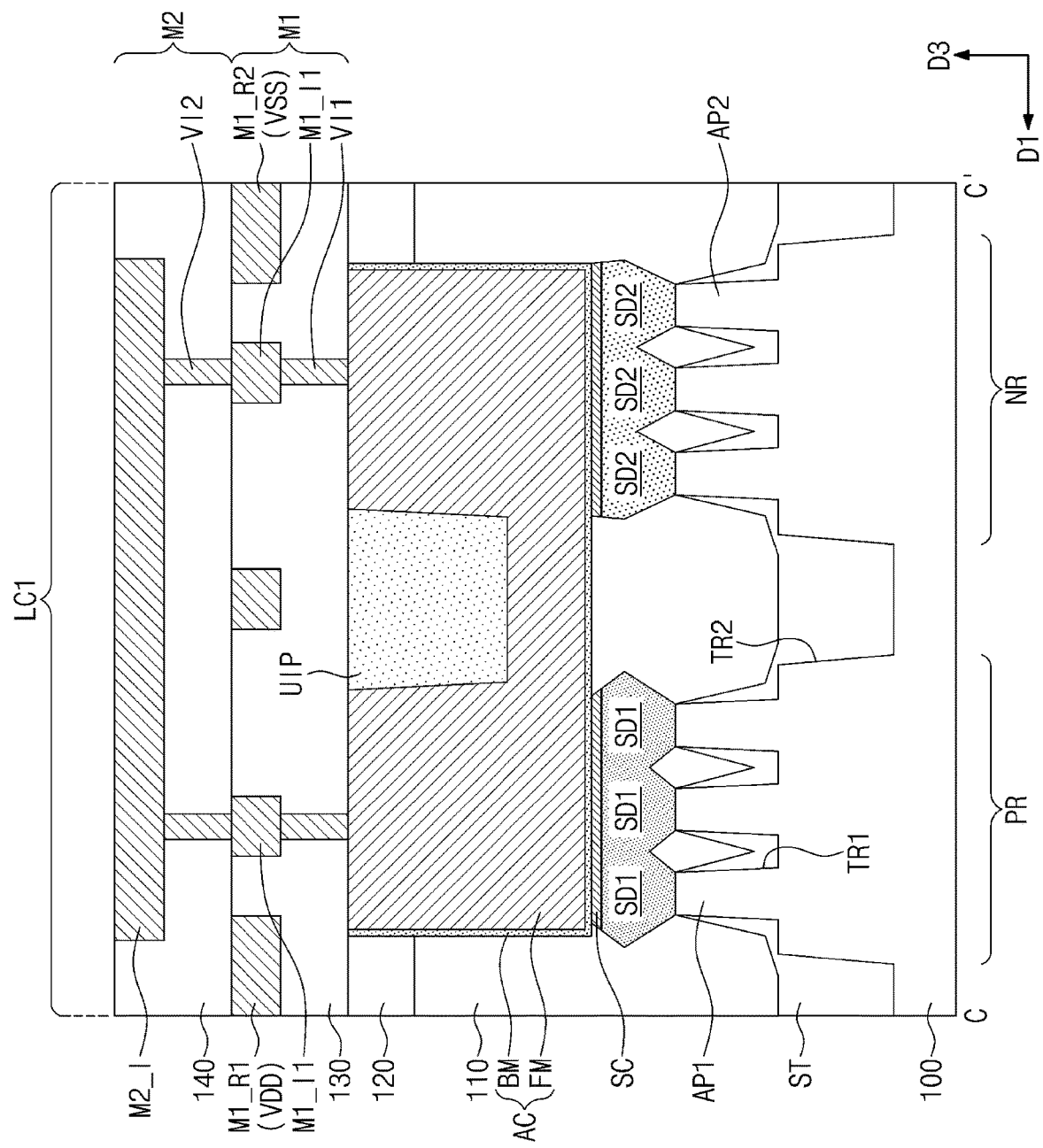
Figure 3D:
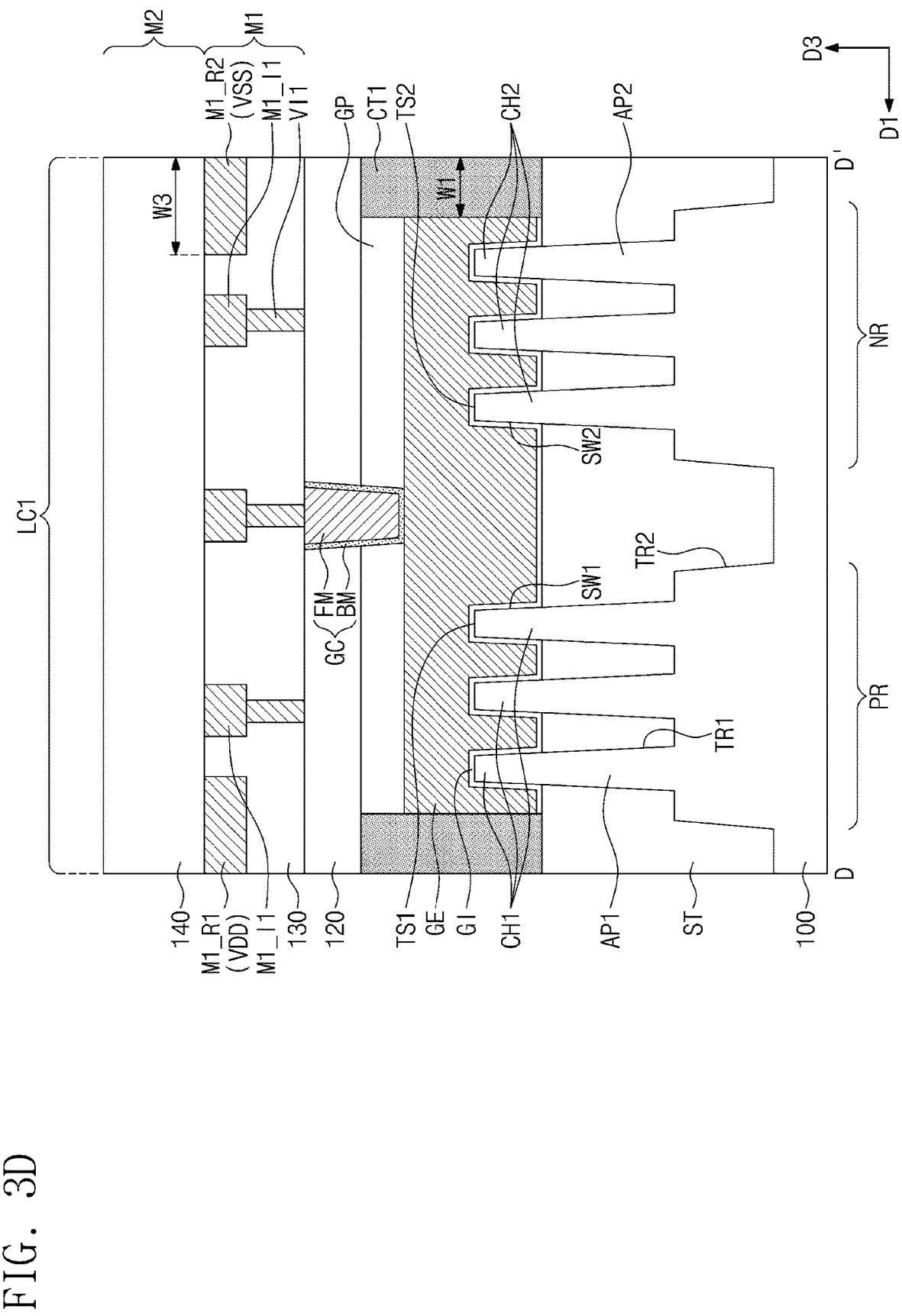
Figure 3E:
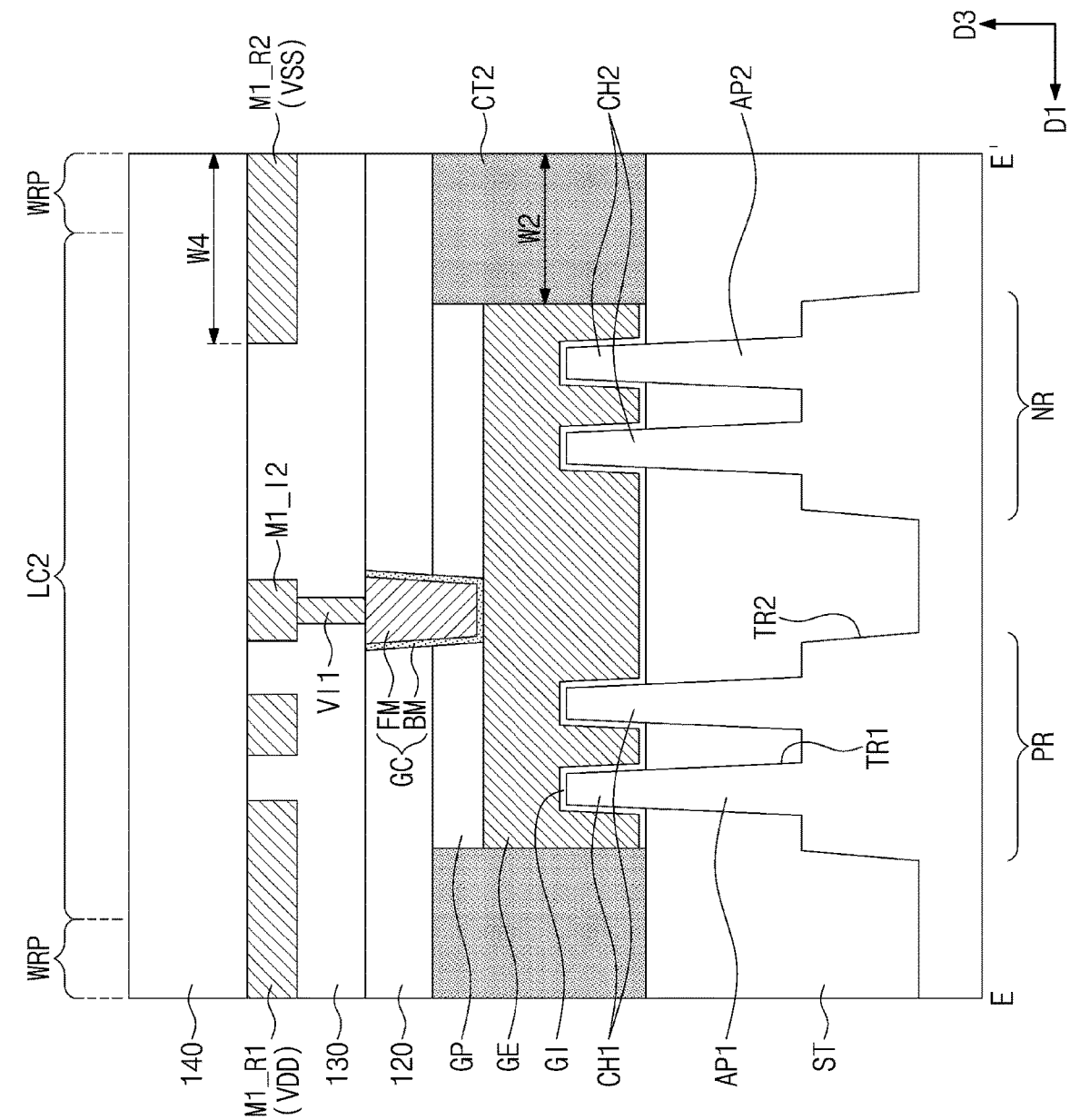
Figure 3F:
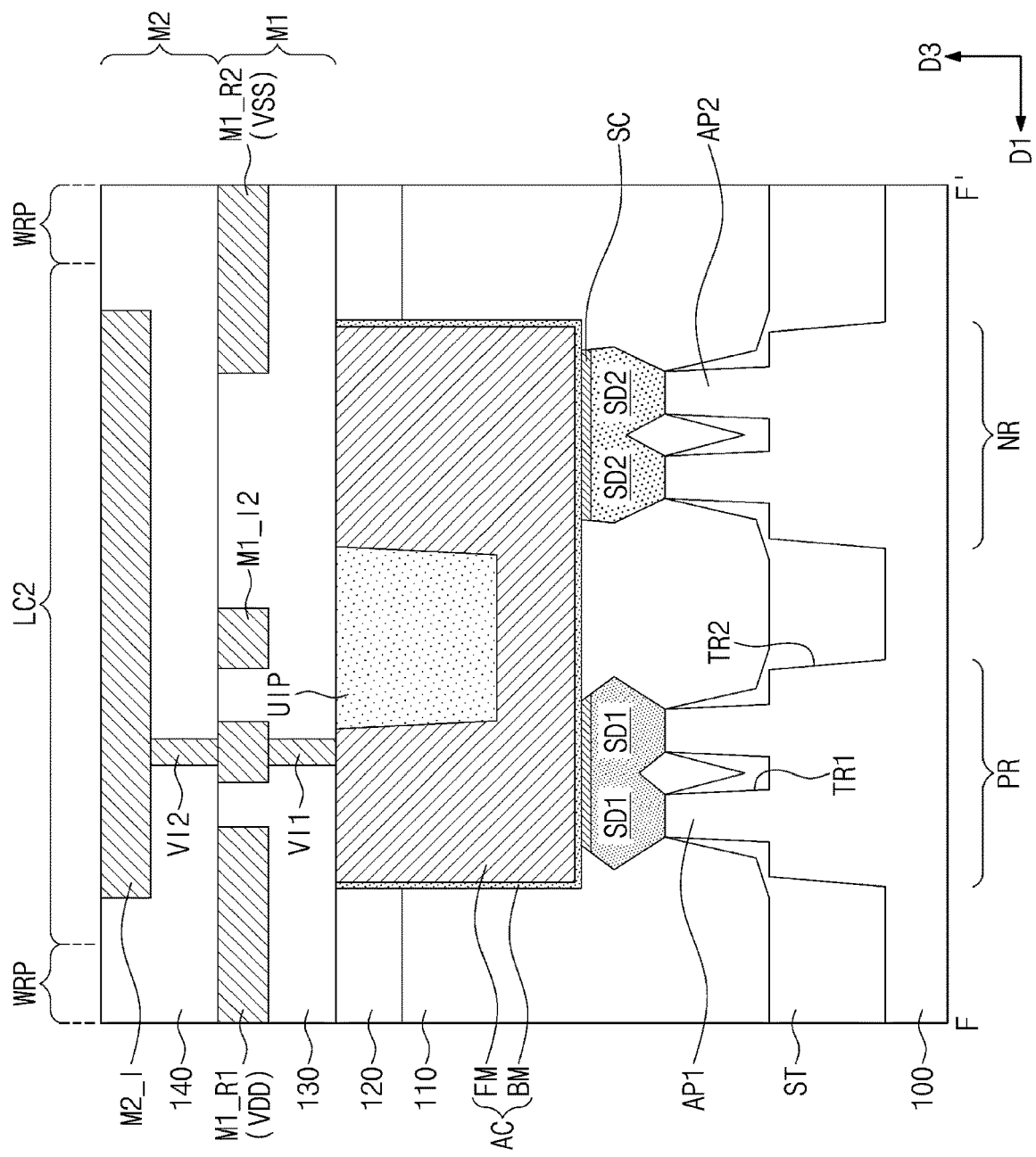

FIG. 2 illustrates a detailed plan view showing section M of FIG. 1. FIGS. 3A, 3B, 3C, 3D, 3E, and 3F illustrate cross-sectional views respectively taken along lines A-A', B-B', C-C', D-D', E-E', and F-F' of FIG. 2.

The substrate 100 may be provided thereon with the first logic cell LC1, the second logic cell LC2, and the hybrid filler cell HFI between the first and second logic cells LC1 and LC2. Each of the first and second logic cells LC1 and LC2 may include logic transistors that constitute a logic circuit.

The following will describe in detail the first logic cell LC1 with reference to FIGS. 2 and 3A to 3D. The substrate 100 may include a first active region PR and a second active region NR. In some example embodiments, the first active region PR may be a PMOS-FET area, and the second active region NR may be an NMOS-FET area. The substrate 100 may be a compound semiconductor substrate or a semiconductor substrate including silicon, germanium, or silicon-germanium. For example, the substrate 100 may be a silicon substrate.

The first active region PR and the second active region NR may be defined by a second trench TR2 formed on an upper portion of the substrate 100. The second trench TR2 may be positioned between the first active region PR and the second active region NR. The first active region PR and the second active region NR may be spaced apart from each other in the first direction D1 across the second trench TR2. Each of the first and second active regions PR and NR may extend in a second direction D2 that intersects the first direction D1.

First active patterns AP1 and second active patterns AP2 may be respectively provided on the first active region PR and the second active region NR. The first and second active patterns AP1 and AP2 may extend lengthwise in the second direction D2 and may be parallel to each other. The first and second active patterns AP1 and AP2 may be vertically protruding portions of the substrate 100. A first trench TR1 may be defined between neighboring first active patterns AP1 and between neighboring second active patterns AP2. The first trench TR1 may be shallower than the second trench TR2.

A device isolation layer ST may fill the first and second trenches TR1 and TR2. The device isolation layer ST may include a silicon oxide layer. The first and second active patterns AP1 and AP2 may have their upper portions that vertically protrude upwards from the device isolation layer ST (see FIG. 3D). Each of the first and second active patterns AP1 and AP2 may have a fin shape at the upper portion thereof. The device isolation layer ST may not cover the upper portions of the first and second active patterns AP1 and AP2. The device isolation layer ST may cover lower sidewalls of the first and second active patterns AP1 and AP2.

First source/drain patterns SD1 may be provided on the upper portions of the first active patterns AP1. The first source/drain patterns SD1 may be impurity regions having a first conductivity type (e.g., p-type). A first channel pattern CH1 may be interposed between a pair of first source/drain patterns SD1. Second source/drain patterns SD2 may be provided on the upper portions of the second active patterns AP2. The second source/drain patterns SD2 may be impurity regions having a second conductivity type (e.g., n-type). A second channel pattern CH2 may be interposed between a pair of second source/drain patterns SD2.

The first and second source/drain patterns SD1 and SD2 may be epitaxial patterns formed by a selective epitaxial growth process. For example, the first and second source/drain patterns SD1 and SD2 may have their top surfaces coplanar with those of the first and second channel patterns CH1 and CH2. For another example, the first and second source/drain patterns SD1 and SD2 may have their top surfaces higher than those of the first and second channel patterns CH1 and CH2.

The first source/drain patterns SD1 may include a semiconductor element (e.g., SiGe) whose lattice constant is greater than that of a semiconductor element of the substrate 100. Therefore, the first source/drain patterns SD1 may provide the first channel patterns CH1 with compressive stress. For example, the second source/drain patterns SD2 may include the same semiconductor element (e.g., Si) as that of the substrate 100.

Gate electrodes GE may be provided to extend lengthwise in the first direction D1, while running across the first and second active patterns AP1 and AP2. The gate electrodes GE may be arranged along the second direction D2. The gate electrodes GE may vertically overlap the first and second channel patterns CH1 and CH2. The gate electrode GE may surround a top surface and opposite sidewalls of each of the first and second channel patterns CH1 and CH2.

Referring back to FIG. 3D, the gate electrode GE may be provided on a first top surface TS1 of the first channel pattern CH1 and on at least one first sidewall SW1 of the first channel pattern CH1. The gate electrode GE may be provided on a second top surface TS2 of the second channel pattern CH2 and on at least one second sidewall SW2 of the second channel pattern CH2. For example, a transistor according to some example embodiments may be a three-dimensional field effect transistor (e.g., 3DFET) in which the gate electrode GE three-dimensionally surrounds the first and second channel patterns CH1 and CH2.

Referring back to FIGS. 2 and 3A to 3D, a pair of gate spacers GS may be disposed on opposite sidewalls of each of the gate electrodes GE. The gate spacer GS may extend in the first direction D1 along the gate electrode GE. The gate spacer GS may have a top surface higher than that of the gate electrode GE. The top surface of the gate spacer GS may be coplanar with that of a first interlayer dielectric layer 110 which will be discussed below. The gate spacer GS may include one or more of SiCN, SiCON, and SiN. Alternatively, the gate spacer GS may include a multi-layer consisting of two or more of SiCN, SiCON, and SiN.

A gate capping pattern GP may be provided on each of the gate electrodes GE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include one or more of SiON, SiCN, SiCON, and SiN.

A gate dielectric pattern GI may be interposed between the gate electrode GE and the first active pattern AP1 and between the gate electrode GE and the second active pattern AP2. The gate dielectric pattern GI may extend along a bottom surface of the gate electrode GE that overlies the gate dielectric pattern GI. For example, the gate dielectric pattern GI may cover the first top surface TS1 and the first sidewall SW1 of the first channel pattern CH1. The gate dielectric pattern GI may cover the second top surface TS2 and the second sidewall SW2 of the second channel pattern CH2. The gate dielectric pattern GI may cover a top surface of the device isolation layer ST that underlies the gate electrode GE (see FIG. 3D).

In some example embodiments, the gate dielectric pattern GI may include a high-k dielectric material whose dielectric constant is greater than that of a silicon oxide layer. For example, the high-k dielectric material may include one or more of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate electrode GE may include a first metal pattern and a second metal pattern on the first metal pattern. The first metal pattern may be provided on the gate dielectric pattern GI and adjacent to the first and second channel patterns CH1 and CH2. The first metal pattern may include a work function metal that controls a threshold voltage of a transistor. A thickness and composition of the first metal pattern may be adjusted to achieve desired threshold voltage.

The first metal pattern may include a metal nitride layer. For example, the first metal pattern may include nitrogen (N) and one or more of titanium (Ti), tantalum (Ta), aluminum (Al), tungsten (W), and molybdenum (Mo). The first metal pattern may further include carbon (C). The first metal pattern may include a plurality of work function metal layers that are stacked.

The second metal pattern may include metal whose resistance is less than that of the first metal pattern. For example, the second metal pattern may include one or more of tungsten (W), aluminum (Al), titanium (Ti), and tantalum (Ta).

Referring again to FIG. 3D, first cutting patterns CT1 may be correspondingly provided on opposite ends of the gate electrode GE of the first logic cell LC1. The first cutting pattern CT1 may separate the gate electrode GE of the first logic cell LC1 from a gate electrode of a different logic cell adjacent thereto. The first cutting pattern CT1 may include a dielectric material, such as a silicon oxide layer and/or a silicon nitride layer. The first cutting pattern CT1 may have a first width W1 in the first direction D1.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with those of the gate capping patterns GP and those of the gate spacers GS. The first interlayer dielectric layer 110 may be provided thereon with a second interlayer dielectric layer 120 that covers the gate capping patterns GP. A third interlayer dielectric layer 130 may be provided on the second interlayer dielectric layer 120. A fourth interlayer dielectric layer 140 may be provided on the third interlayer dielectric layer 130. For example, the first to fourth interlayer dielectric layers 110 to 140 may include a silicon oxide layer.

A pair of separation structures DB may be provided on opposite boundaries of the first logic cell LC1 that face each other in the second direction D2. The separation structure DB may extend in the first direction D1 parallel to the gate electrodes GE.

The separation structure DB may penetrate the first and second interlayer dielectric layers 110 and 120, and may extend into the first and second active patterns AP1 and AP2. The separation structure DB may penetrate the upper portion of each of the first and second active patterns AP1 and AP2. The separation structure DB may separate each of the first and second active regions PR and NR of the first logic cell LC1 from active regions of a different logic cell adjacent thereto.

Active contacts AC may be provided to penetrate the first and second interlayer dielectric layers 110 and 120 and to have electrical connections with the first and second source/drain patterns SD1 and SD2. For example, the active contact AC of the first logic cell LC1 may be provided between the gate electrode GE and the separation structure DB. The active contact AC may extend in the first direction D1 to connect the second source/drain pattern SD2 to the first source/drain pattern SD1 (see FIG. 3C).

The active contact AC may be a self-aligned contact. In some example embodiments, the gate capping pattern GP and the gate spacer GS may be used to form the active contact AC in a self-alignment manner. For example, the active contact AC may cover at least a portion of a sidewall of the gate spacer GS. Although not shown, the active contact AC may partially cover the top surface of the gate capping pattern GP.

A silicide pattern SC may be interposed between the active contact AC and the first source/drain pattern SD1 and between the active contact AC and the second source/drain pattern SD2. The active contact AC may be electrically connected through the silicide pattern SC to the first and second source/drain patterns SD1 and SD2. As used herein, the term "electrically connected" may be used to describe items configured such that an electrical signal can be passed from one item to the other. In contrast, a passive electrically conductive component (e.g., a wire, pad, internal electrical line, etc.) physically connected to an insulating layer is not electrically connected to that component. The silicide pattern SC may include metal silicide, for example, one or more of titanium silicide, tantalum silicide, tungsten silicide, nickel silicide, and cobalt silicide.

Gate contacts GC may be provided to penetrate the second interlayer dielectric layer 120 and the gate capping pattern GP and to have electrical connections with corresponding gate electrodes GE. For example, referring to FIG. 3C, an upper dielectric pattern UIP may fill an upper portion of the active contact AC adjacent to the gate contact GC. Therefore, it may be possible to prevent an electrical short caused by contact between the gate contact GC and its adjacent active contact AC.

Each of the active contact AC and the gate contact GC may include a conductive pattern FM and a barrier pattern BM that surrounds the conductive pattern FM. For example, the conductive pattern FM may include one or more of aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include one or more of titanium, tantalum, tungsten, nickel, cobalt, and platinum. The metal nitride layer may include one or more of a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A first metal layer M1 may be provided in the third interlayer dielectric layer 130. In example embodiments, although not shown, the first metal layer M1 may be provided on the third interlayer dielectric layer 130. The first metal layer M1 of the first logic cell LC1 may include a first power line M1_R1, a second power line M1_R2, and first lower lines M1_I1 between the first and second power lines M1_R1 and M1_R2.

The first power line M1_R1 and the second power line M1_R2 may each extend lengthwise in the second direction D2, while running across the first logic cell LC1. The first lower lines M1_I1 may be disposed between the first and second power lines M1_R1 and M1_R2. Each of the first lower lines M1_I1 may have a linear or bar shape that extends lengthwise in the second direction D2.

In some example embodiments, referring back to FIG. 2, first line tracks MTR1 may be defined on the first metal layer M1 of the first logic cell LC1. The first line tracks MTR1 may be defined between the first and second power lines M1_R1 and M1_R2. The first line tracks MTR1 may be imaginary lines that extend parallel to each other in the second direction D2. The first line tracks MTR1 may be arranged along the first direction D1 at a first pitch P1. For example, the first pitch P1 may be a distance between adjacent first line tracks MTR1.

The first line tracks MTR1 may define positions where the first lower lines M1_I1 are disposed. For example, one of the first line tracks MTR1 may be disposed at a center in the first direction D1 of one of the first lower lines M1_I1. FIG. 2 shows that the first logic cell LC1 includes five first line tracks MTR1 and three first lower lines M1_I1 disposed aligned with the corresponding first line tracks MTR1.

The first metal layer M1 may further include lower vias VI1. Each of the lower vias VI1 may be provided below a certain wiring line of the first metal layer M1. For example, the lower via VI1 may be interposed between and electrically connect the active contact AC and the first lower line M1_I1. The lower via VI1 may be interposed between and electrically connect the active contact AC and one of the first and second power lines M1_R1 and M1_R2. The lower via VI1 may be interposed between and electrically connect the gate contact GC and the first lower line M1_I1.

In some example embodiments, a certain wiring line of the first metal layer M1 and its underlying lower via VI1 may be individually formed by separate processes. For example, a certain wiring line of the first metal layer M1 and the lower via VI1 may each be formed by a single damascene process. A sub-20 nm process may be employed to fabricate a semiconductor device according to some example embodiments.

A second metal layer M2 may be provided in the fourth interlayer dielectric layer 140. In example embodiments, although not shown, the second metal layer M2 may be provided on the fourth interlayer dielectric layer 140. The second metal layer M2 may include upper lines M2_I. Each of the upper lines M2_I of the second metal layer M2 may have a linear or bar shape that extends lengthwise in the first direction D1. For example, the upper lines M2_I may extend lengthwise in the first direction D1 and may be parallel to each other.

The second metal layer M2 may further include upper vias VI2. Each of the upper vias VI2 may be provided below the upper line M2_I. The upper line M2_I may be electrically connected through the upper via VI2 to the first lower line M1_I1.

In some example embodiments, the upper line M2_I of the second metal layer M2 and its underlying upper via VI2 may be simultaneously formed in a single process. For example, a dual damascene process may be employed to simultaneously form the upper via VI2 and the upper line M2_I of the second metal layer M2.

The first and second metal layers M1 and M2 may have their wiring lines that include the same or different conductive materials. For example, the first and second metal layers M1 and M2 may have their wiring lines that include at least one metallic material selected from aluminum, copper, tungsten, molybdenum, and cobalt. Although not shown, the fourth interlayer dielectric layer 140 may further be provided thereon with metal layers stacked thereon. Each of the stacked metal layers may include wiring lines for routing.

The following will describe in detail the second logic cell LC2 with reference to FIGS. 2, 3A, 3B, 3E, and 3F. In the embodiment that follows, a description of features repetitive to those mentioned about the first logic cell LC1 will be omitted, and a difference thereof will be discussed in detail.

A width in the first direction D1 of the first active region PR on the second logic cell LC2 may be less than a width in the first direction D1 of the first active region PR on the first logic cell LC1. A width in the first direction D1 of the second active region NR on the second logic cell LC2 may be less than a width in the first direction D1 of the second active region NR on the first logic cell LC1. This may be caused by that, as discussed above with reference to FIG. 1, the cell height HE2 of the second logic cell LC2 is less than the cell height HE1 of the first logic cell LC1.

On the second logic cell LC2, the first active patterns AP1 and the second active patterns AP2 may be respectively provided on the first active region PR and the second active region NR. The maximum number of the first active patterns AP1 on the first active region PR of the second logic cell LC2 may be less than the maximum number of the first active patterns AP1 on the first active region PR of the first logic cell LC1. For example, maximally two first active patterns AP1 may be provided on the first active region PR of the second logic cell LC2, whereas maximally three first active patterns AP1 may b provided on the first active region PR of the first logic cell LC1 (see FIGS. 3D and 3E). The maximum number of the second active patterns AP2 on the second active region NR of the second logic cell LC2 may be less than the number of the second active patterns AP2 on the second active region NR of the first logic cell LC1.

Second cutting patterns CT2 may be correspondingly provided on opposite ends of the gate electrode GE on the second logic cell LC2. The second cutting pattern CT2 may have a second width W2 in the first direction D1. The second width W2 may be greater than the first width W1 of the first cutting pattern CT1 discussed above. For example, a cutting pattern defined by the wrapper WRP may cause the second width W2 of the second cutting pattern CT2 to become greater than the first width W1 of the first cutting pattern CT1. A length in the first direction D1 of the gate electrode GE on the second logic cell LC2 may be less than a length in the first direction D1 of the gate electrode GE on the first logic cell LC1 (see FIGS. 3D and 3E).

The second logic cell LC2 may include therein the active contact AC that extends lengthwise in the first direction D1 and electrically connects the first and second source/drain patterns SD1 and SD2 to each other. A length in the first direction D1 of the active contact AC on the second logic cell LC2 may be less than a length in the first direction D1 of the active contact AC on the first logic cell LC1 (see FIGS. 3C and 3F).

The first metal layer M1 of the second logic cell LC2 may include second lower lines M1_I2 between the first and second power lines M1_R1 and M1_R2. Referring back to FIG. 2, second line tracks MTR2 may be defined on the first metal layer M1 of the second logic cell LC2. The second line tracks MTR2 may be defined between the first and second power lines M1_R1 and M1_R2. The second line tracks MTR2 may be imaginary lines that extend parallel to each other in the second direction D2. The second line tracks MTR2 may be arranged along the first direction D1 at a second pitch P2. For example, the second pitch P2 may be a distance between adjacent second line tracks MTR2.

The second line tracks MTR2 may define positions where the second lower lines M1_I2 are disposed. For example, one of the second line tracks MTR2 may be disposed at a center in the first direction D1 of one of the second lower lines M1_I2. FIG. 2 shows that the second logic cell LC2 includes four second line tracks MTR2 and two second lower lines M1_I2 disposed aligned with the corresponding second line tracks MTR2.

The second pitch P2 between the second line tracks MTR2 may be substantially the same as the first pitch P1 between the first line tracks MTR1. In some examples, the second pitch P2 between the second line tracks MTR2 may be different from the first pitch P1 between the first line tracks MTR1. The second line tracks MTR2 may not be aligned with the first line tracks MTR1. For example, the second line tracks MTR2 may be offset in the first direction D1 from corresponding first line tracks MTR1.

The number of the second line tracks MTR2 may be less than the number of the first line tracks MTR1. In some example embodiments, four second line tracks MTR2 may be defined on the second logic cell LC2, and five first line tracks MTR1 may be defined on the first logic cell LC1. For example, the second logic cell LC2 may include maximally four second lower lines M1_I2 that can be arranged in the first direction D1, and the first logic cell LC1 may include maximally five first lower lines M1_I1 that can be arranged in the first direction D1.

Referring back to FIGS. 3D and 3F, on the first logic cell LC1, each of the first and second power lines M1_R1 and M1_R2 may have a third width W3 in the first direction D1. On the second logic cell LC2, each of the first and second power lines M1_R1 and M1_R2 may have a fourth width W4 in the first direction D1. The fourth width W4 may be greater than the third width W3. For example, a power line defined by the wrapper WRP may cause the fourth width W4 to become greater than the third width W3.

Despite the presence of a difference in cell height between the first and second logic cells LC1 and LC2, the second metal layer M2 and its overlying additional metal layers may have the same design rule.

Figure 4:
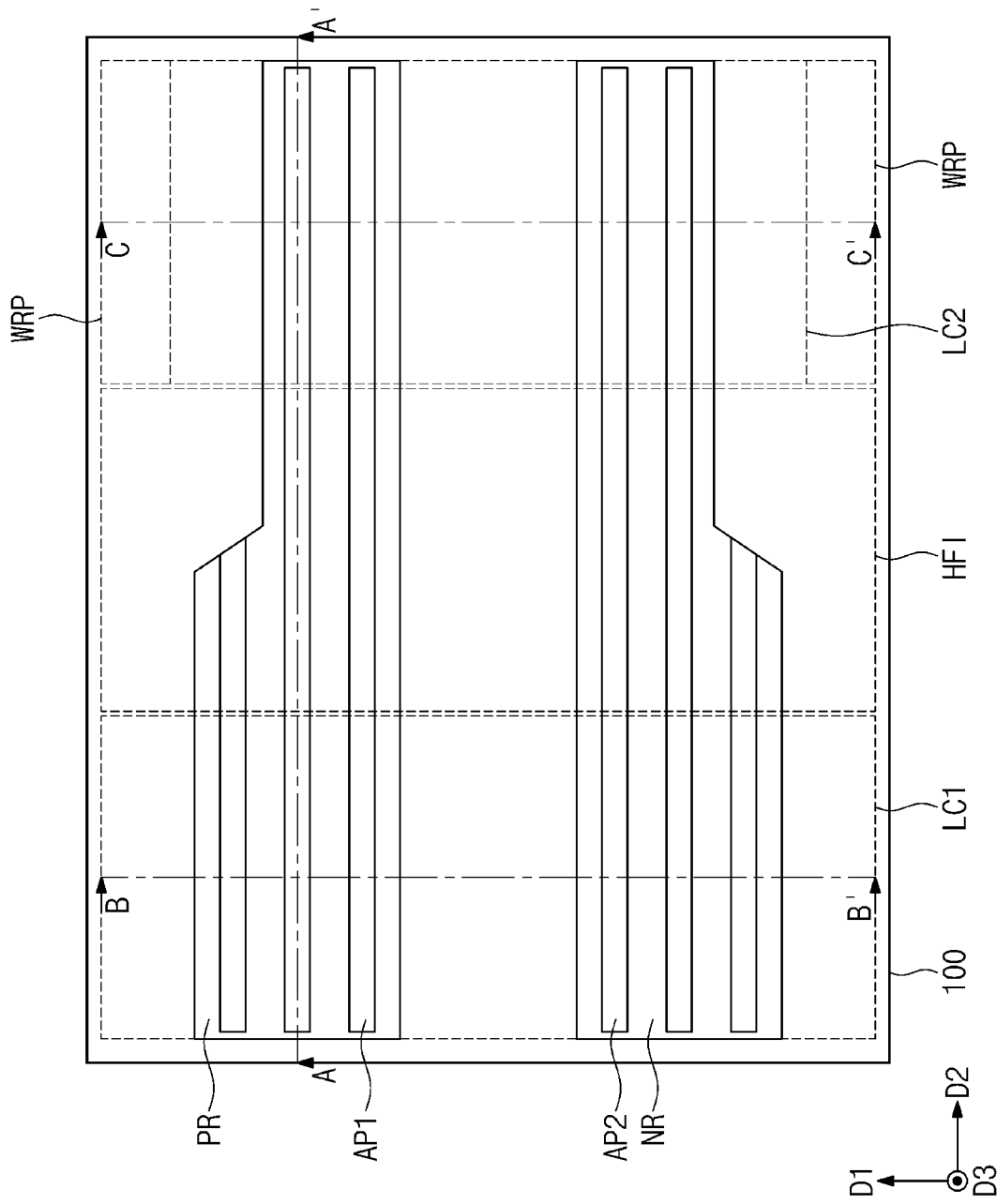
FIGS. 4, 6, and 8 illustrate plan views showing a method of fabricating a semiconductor device according to some example embodiments of the present inventive concepts.
Figure 5A:
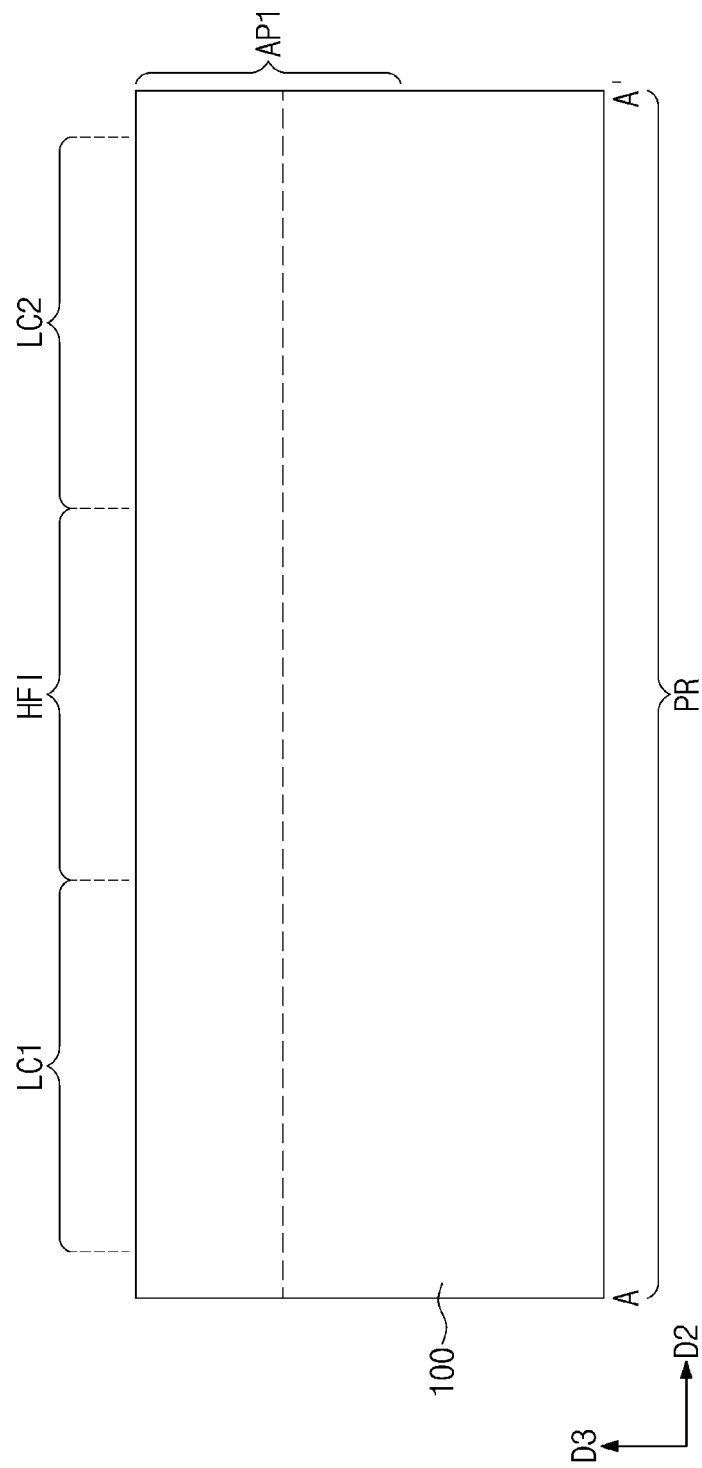
FIGS. 5A, 7A, and 9A illustrate cross-sectional views taken along line A-A' of FIGS. 4, 6, and 8, respectively, according to example embodiments.
Figure 5B:
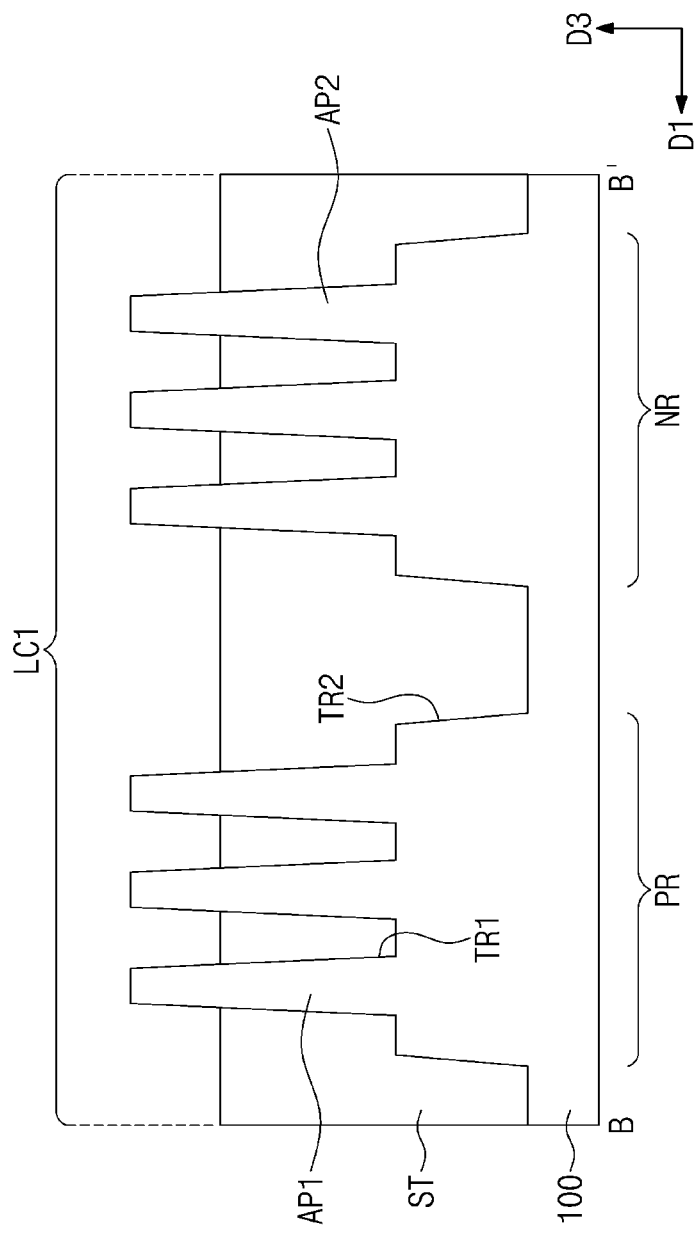
FIGS. 5B, 7B, and 9B illustrate cross-sectional views taken along line B-B' of FIGS. 4, 6, and 8, respectively, according to example embodiments.
Figure 5C:
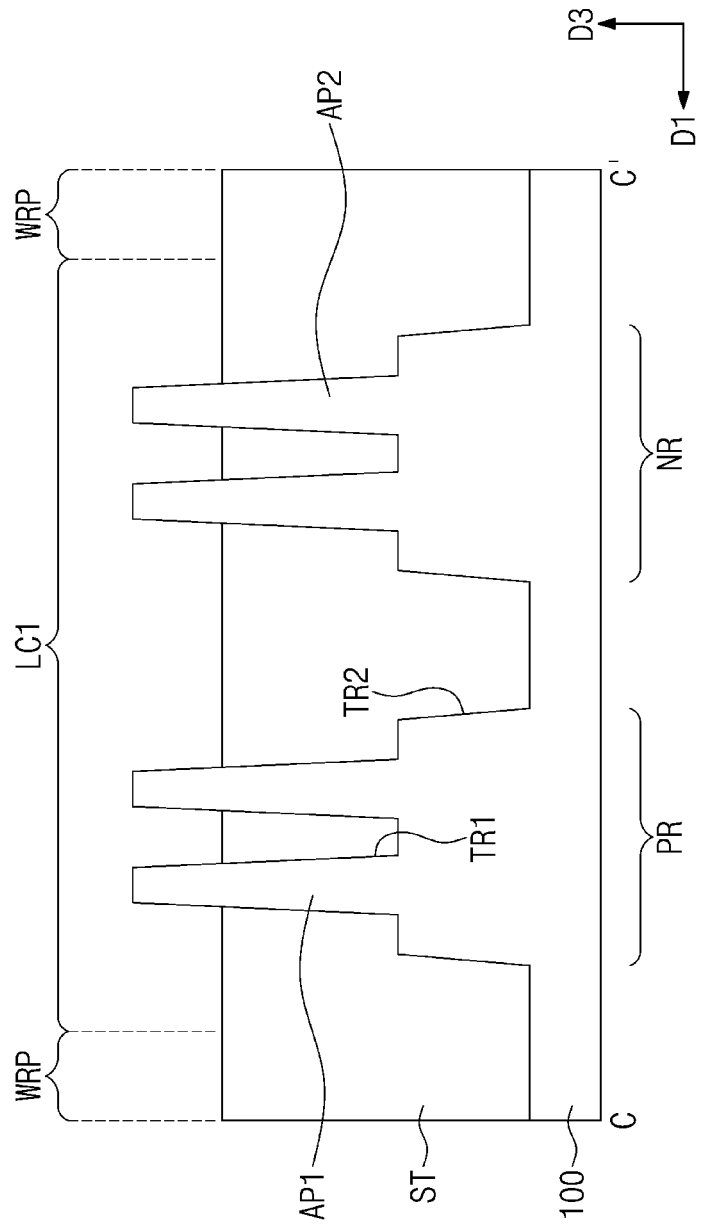
Figure 6:
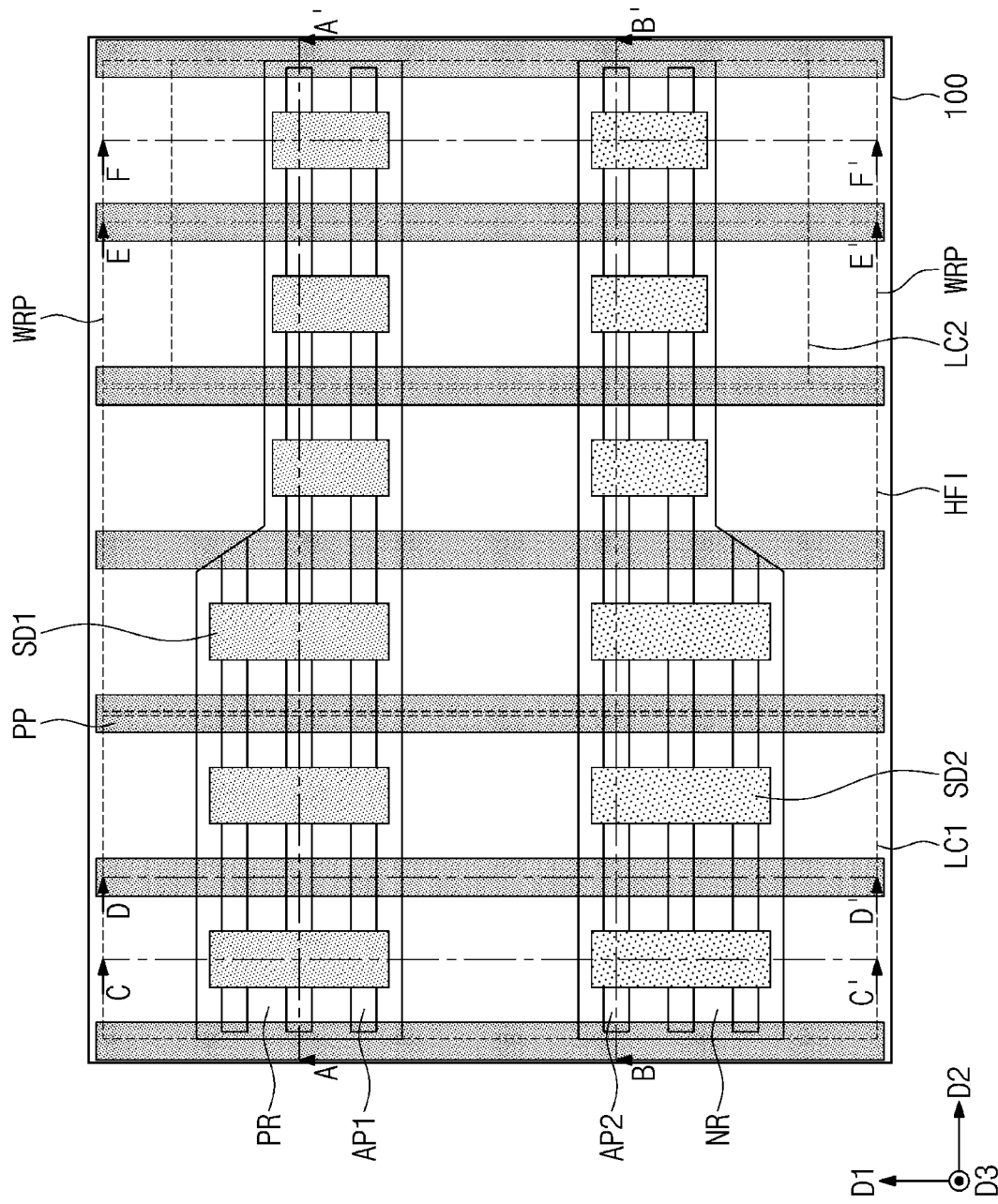
Figure 7A:
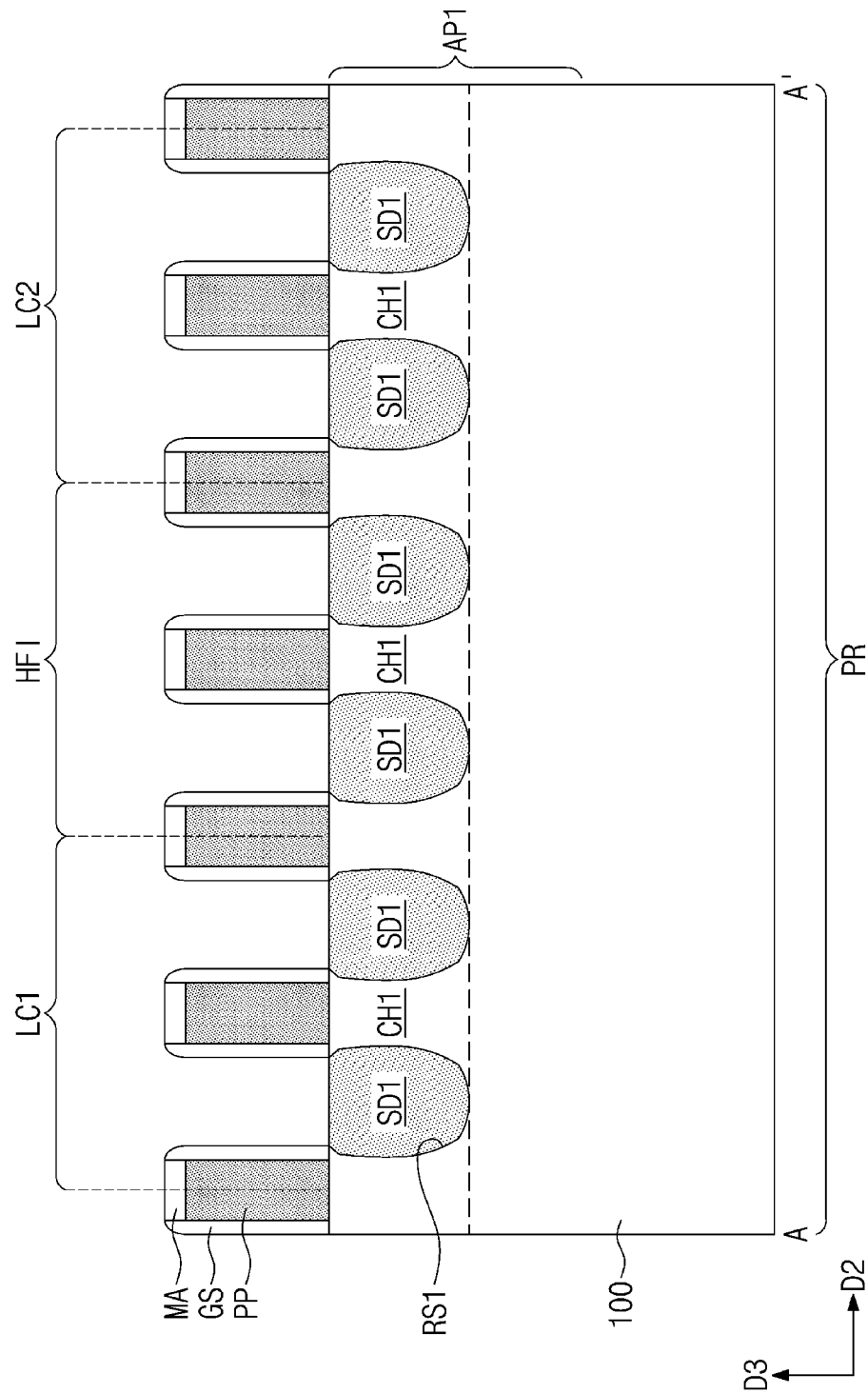
Figure 7B:
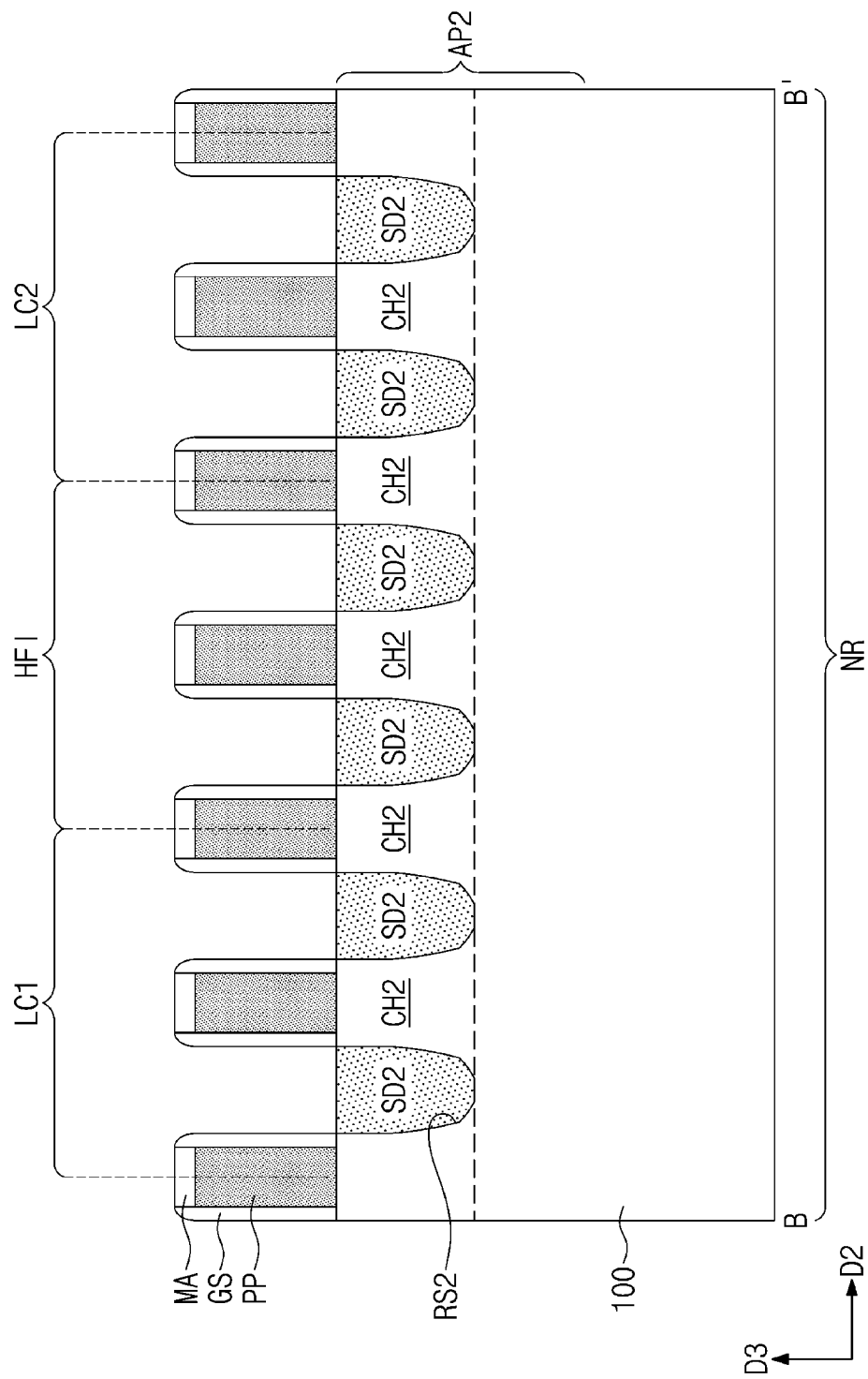
Figure 7C:
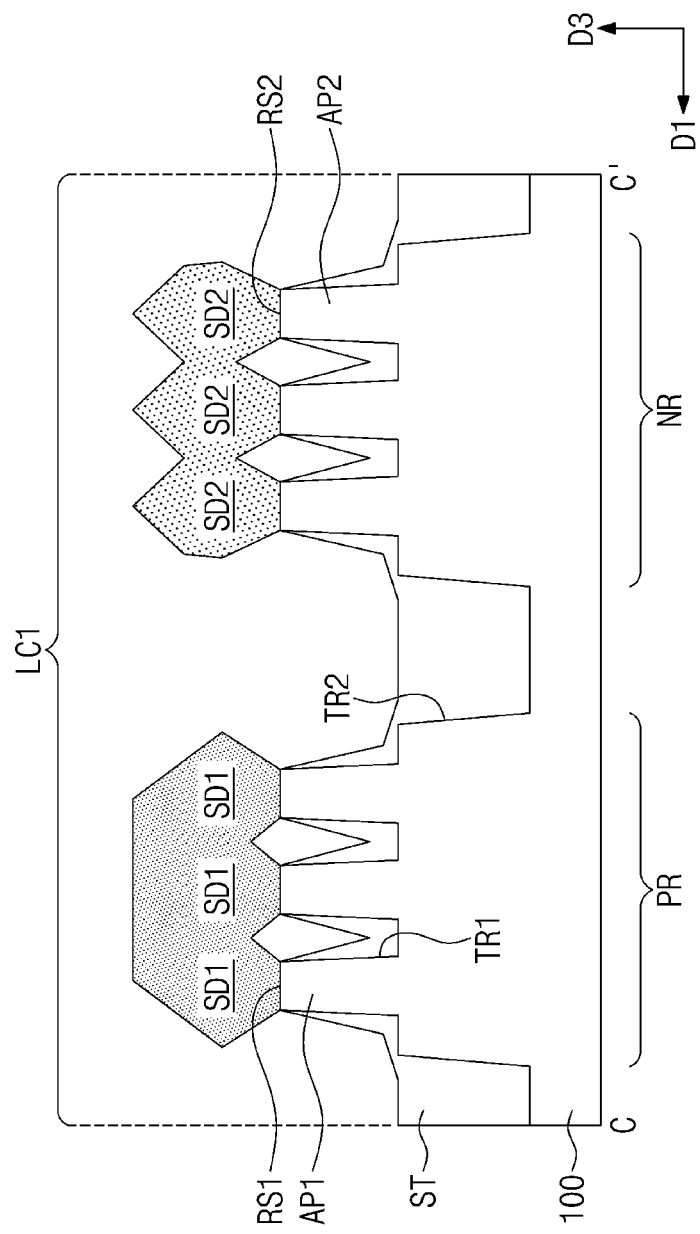
Figure 7D:
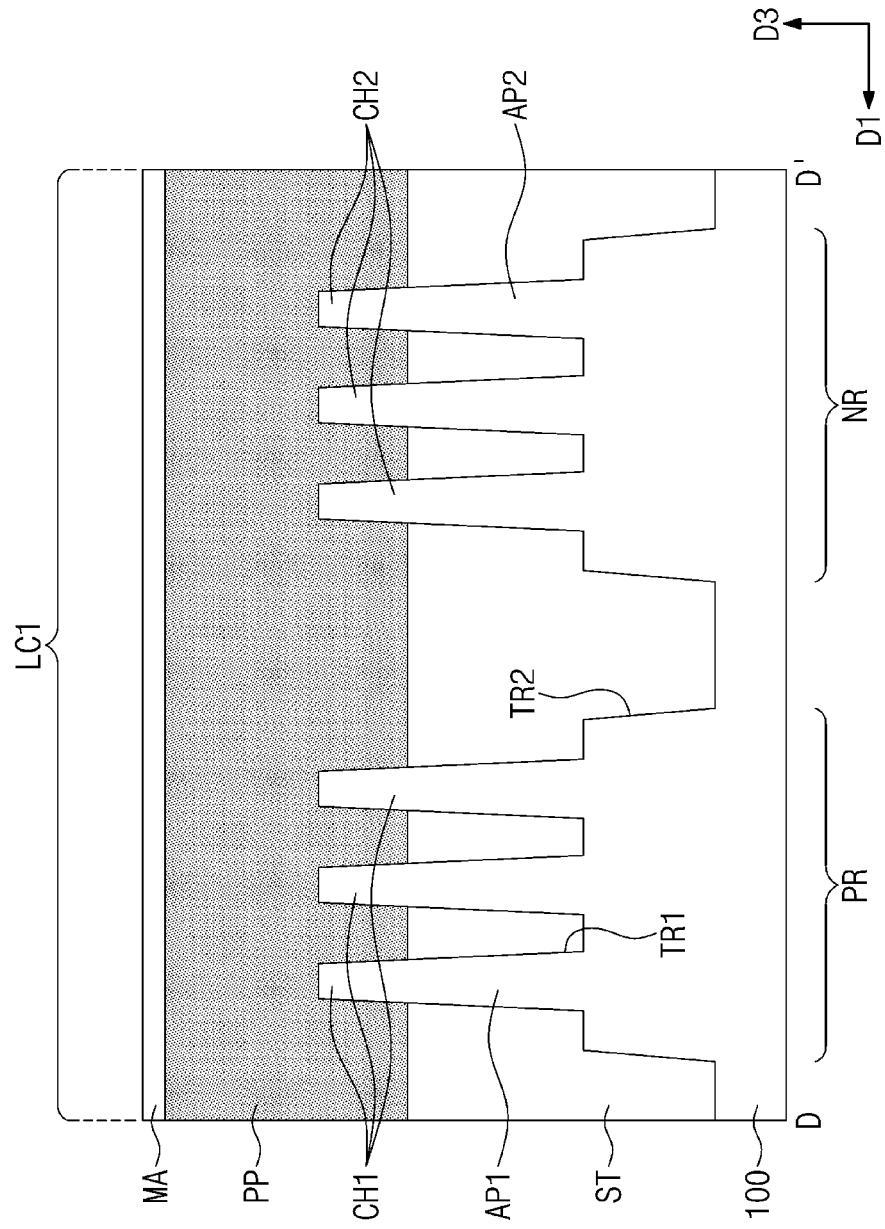
FIGS. 7D and 9D illustrate cross-sectional views taken along line D-D' of FIGS. 6 and 8, respectively, according to example embodiments.
Figure 7F:
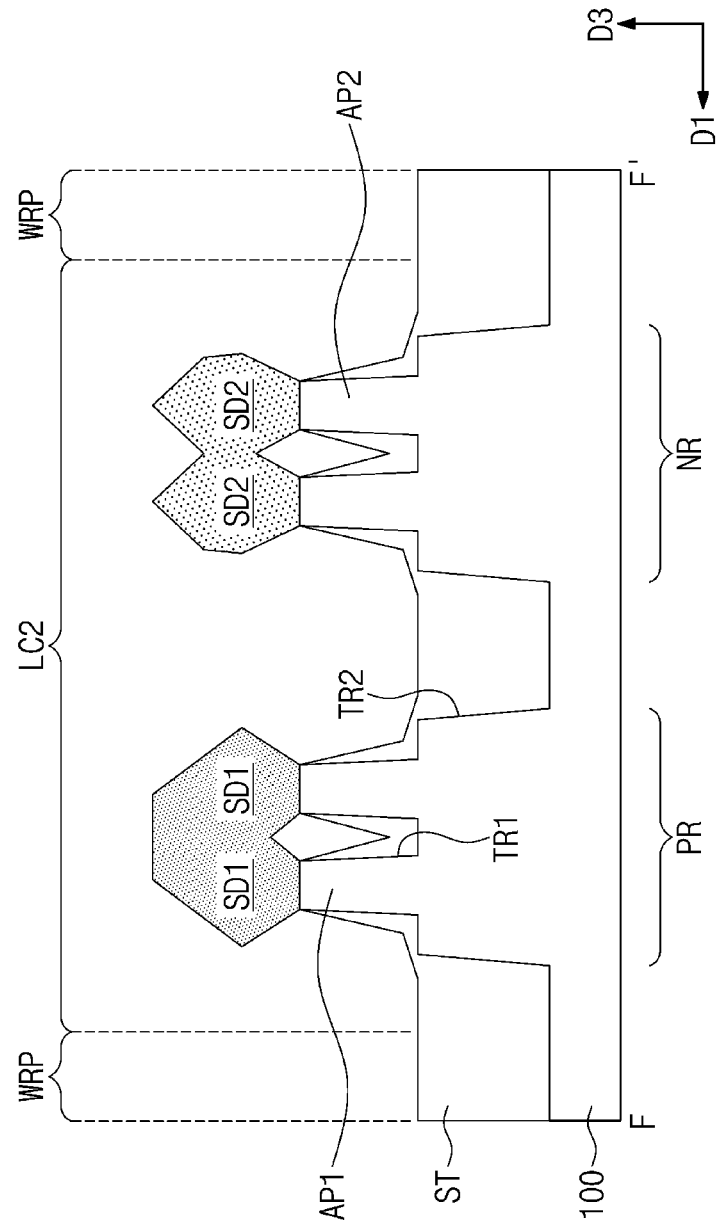
FIGS. 7F and 9F illustrate cross-sectional views taken along line F-F' of FIGS. 6 and 8, respectively, according to example embodiments.
Figure 8:
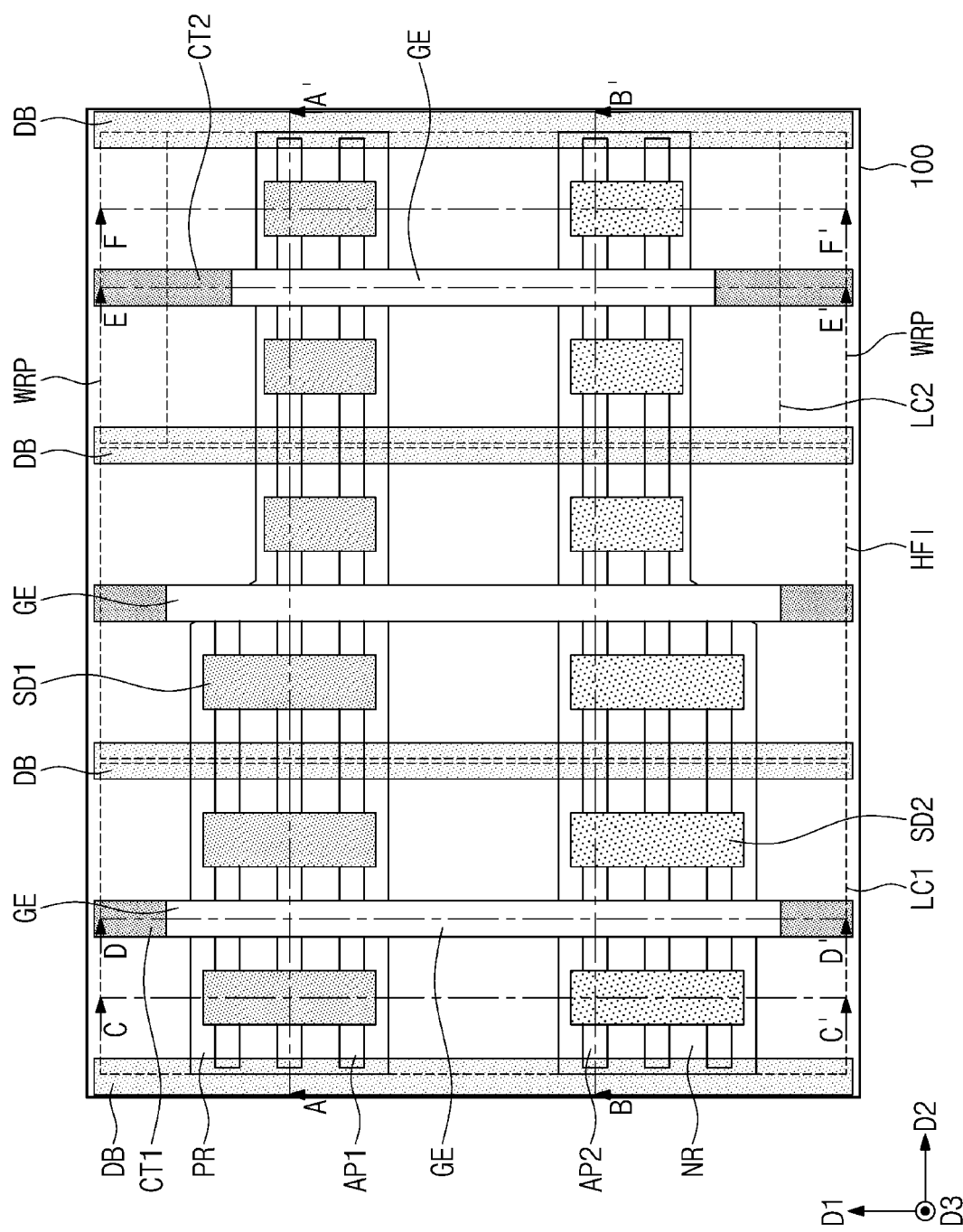
Figure 9A:
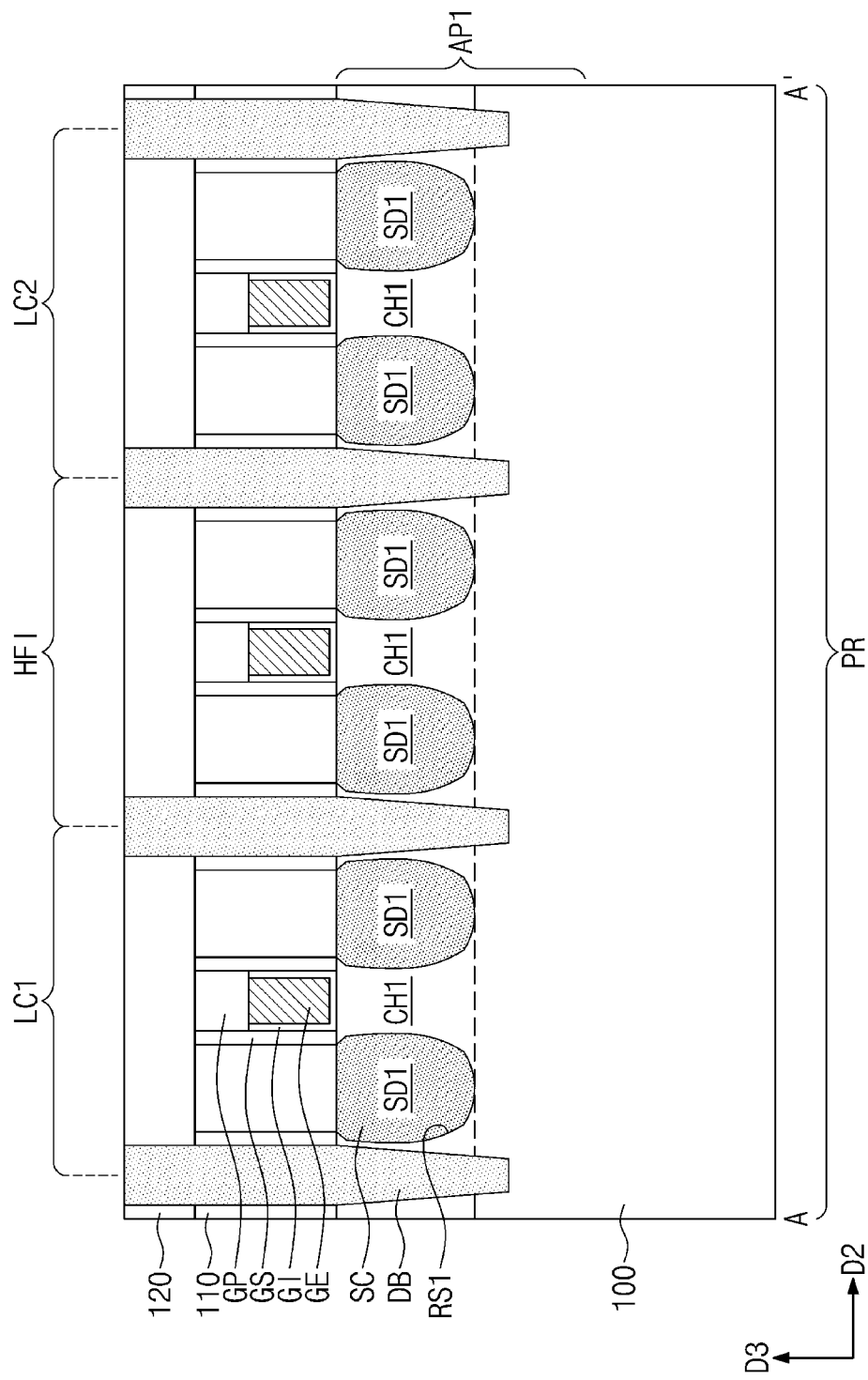
Figure 9B:
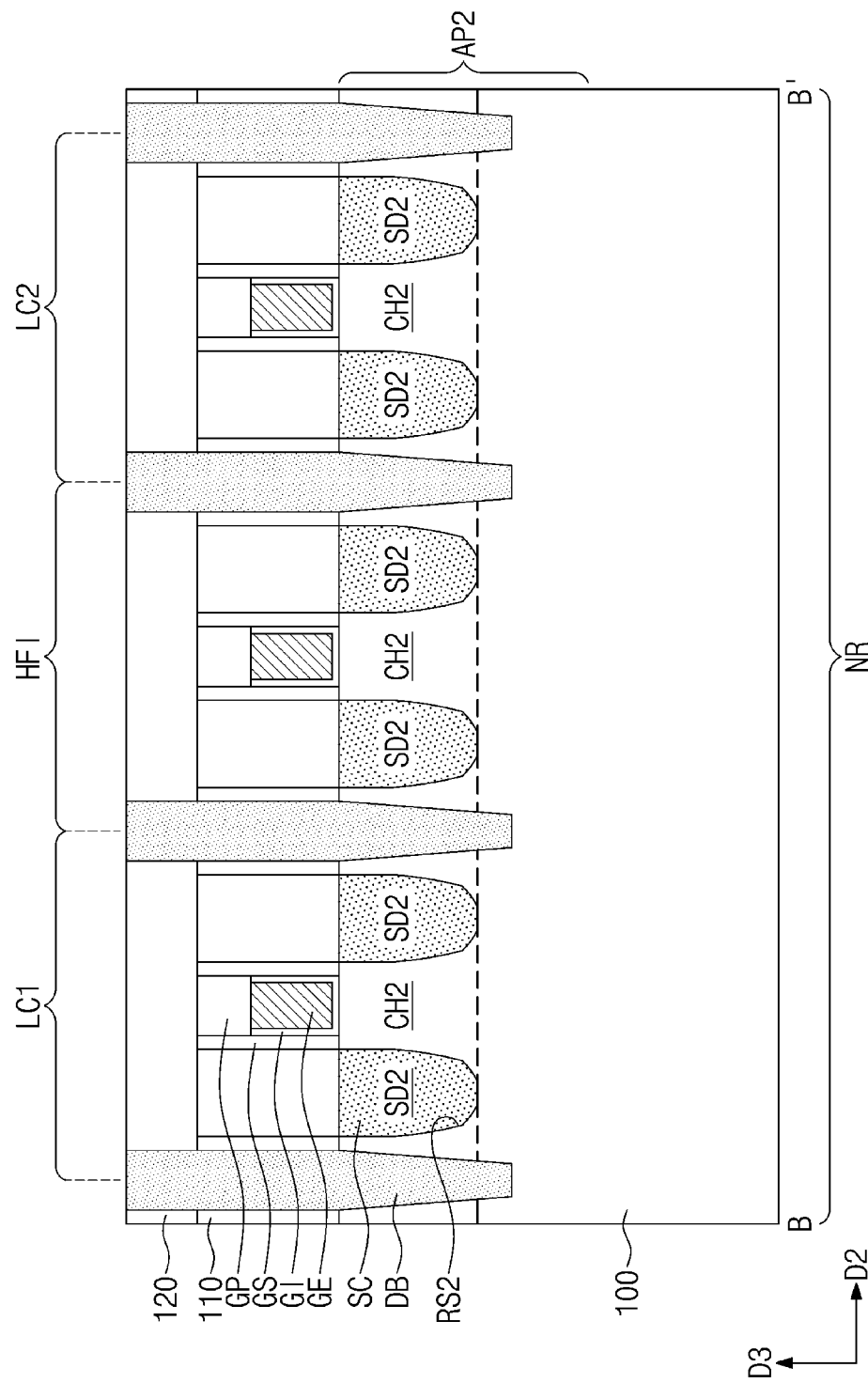
Figure 9D:
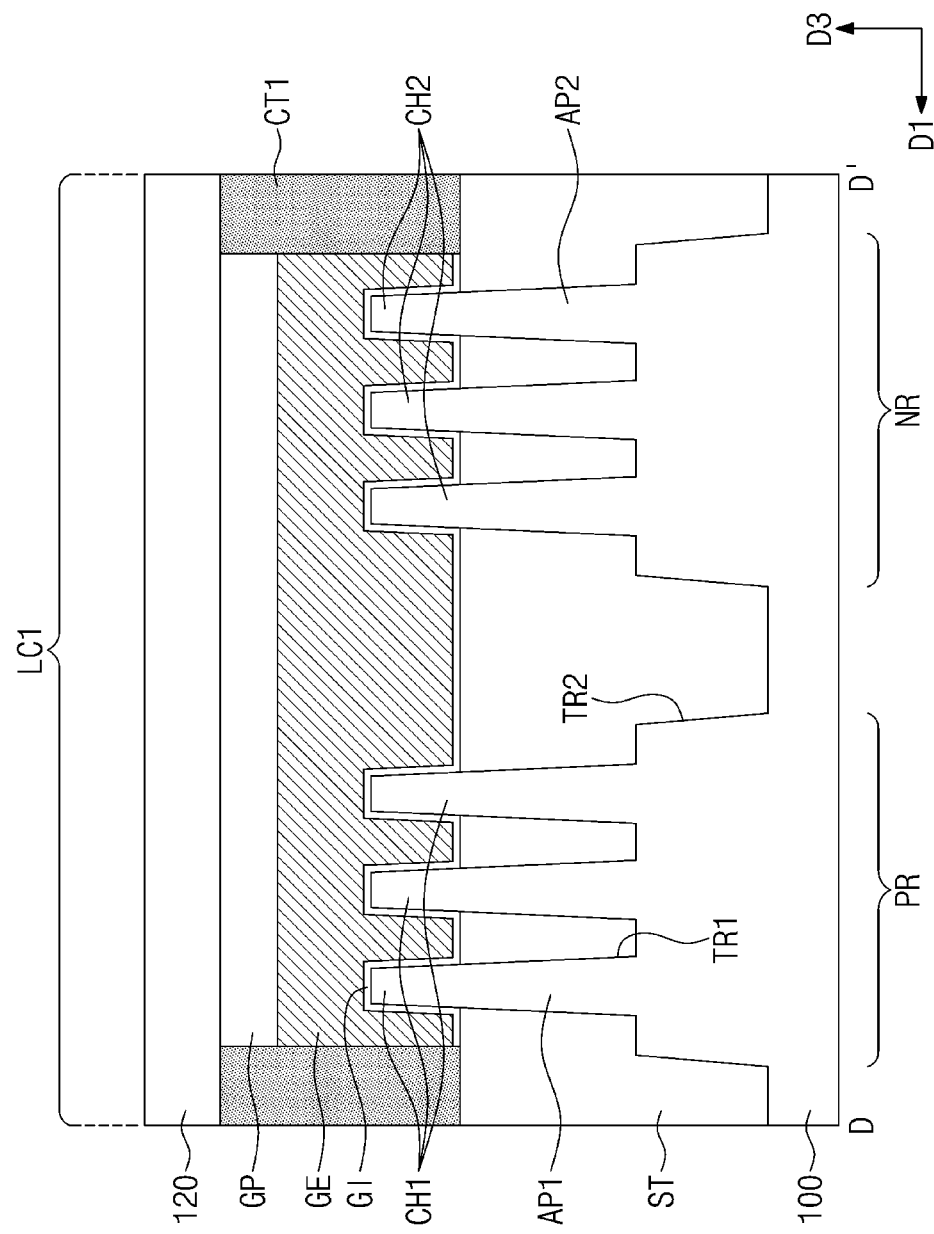
Figure 9E:
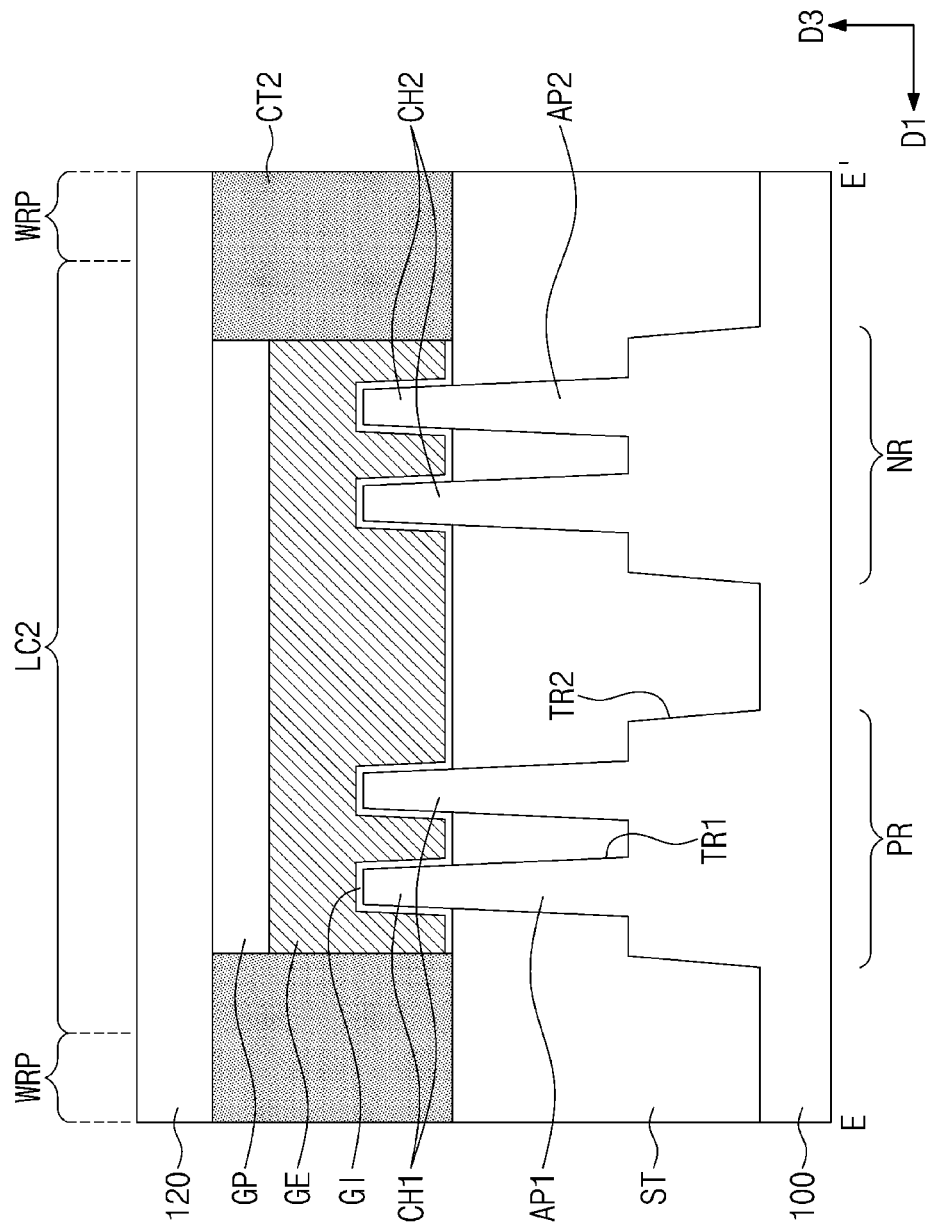
Figure 9F:
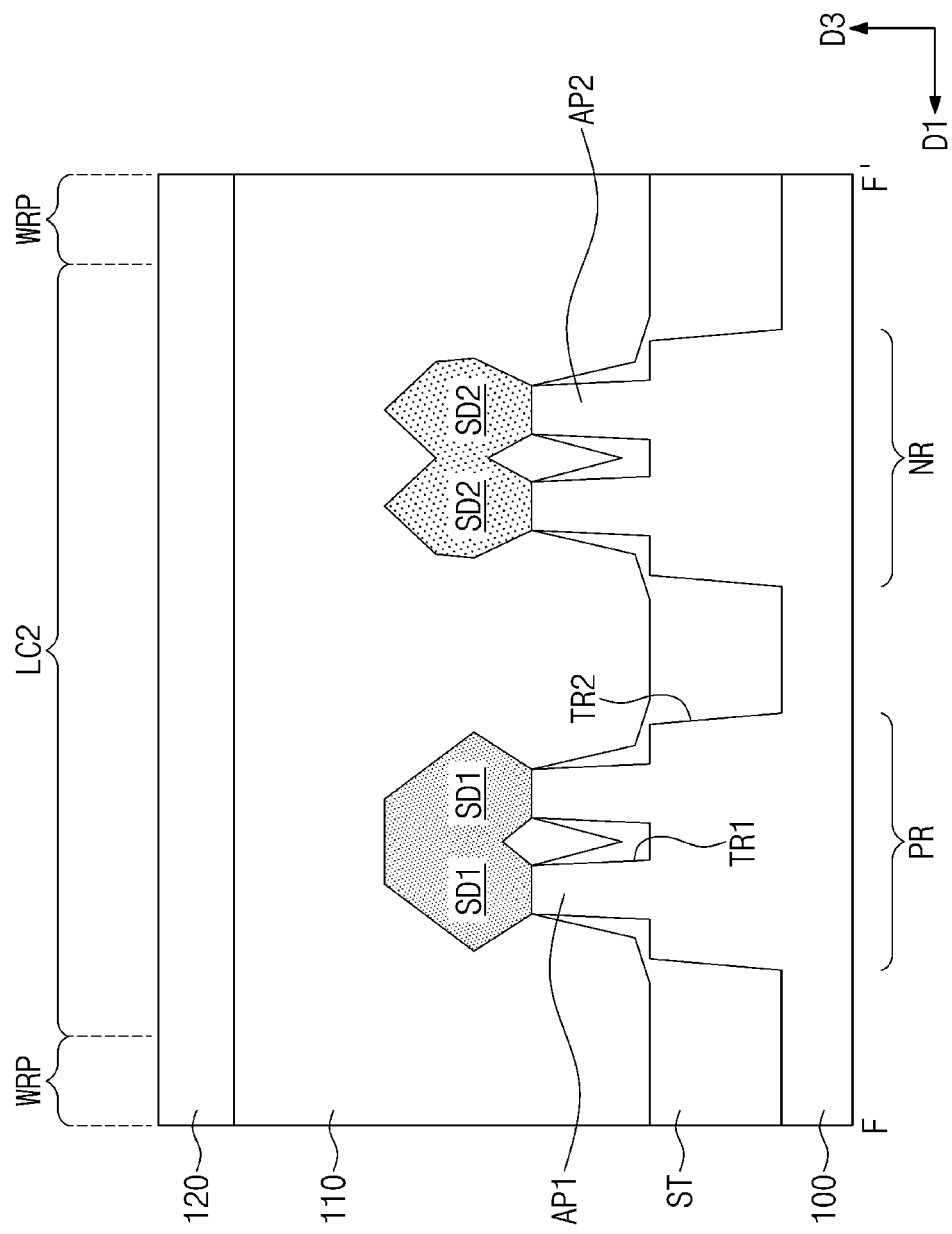

FIGS. 4, 6, and 8 illustrate plan views showing a method of fabricating a semiconductor device according to some example embodiments of the present inventive concepts. FIGS. 5A, 7A, and 9A illustrate cross-sectional views taken along line A-A' of FIGS. 4, 6, and 8, respectively. FIGS. 5B, 7B, and 9B illustrate cross-sectional views taken along line B-B' of FIGS. 4, 6, and 8, respectively. FIGS. 5C, 7C, and 9C illustrate cross-sectional views taken along line C-C' of FIGS. 4, 6, and 8, respectively. FIGS. 7D and 9D illustrate cross-sectional views taken along line D-D' of FIGS. 6 and 8, respectively. FIGS. 7E and 9E illustrate cross-sectional views taken along line E-E' of FIGS. 6 and 8, respectively. FIGS. 7F and 9F illustrate cross-sectional views taken along line F-F' of FIGS. 6 and 8, respectively.

Referring to FIGS. 4 and 5A to 5C, a substrate 100 may be provided thereon with a region where a first logic cell LC1 will be formed, a region where a second logic cell LC2 will be formed, and a region where a hybrid filler cell HFI will be formed between the first and second logic cells LC1 and LC2.

The substrate 100 may undergo a patterning process to form a plurality of active patterns (or active fins) that extend lengthwise in a second direction D2. A first trench TR1 may be defined between the active patterns.

The substrate 100 may be patterned while a first active region PR and a second active region NR are masked, such that a second trench TR2 may be formed to define the first and second active regions PR and NR. The second trench TR2 may be formed deeper than the first trench TR1.

The patterning process may remove active patterns on regions other than the first and second active regions PR and NR. Therefore, first active patterns AP1 may remain on the first active region PR, and second active patterns AP2 may remain on the second active region NR.

For example, three active patterns may remain on each of the first and second active regions PR and NR on the first logic cell LC1, and two active patterns may remain on each of the first and second active regions PR and NR on the second logic cell LC2.

A device isolation layer ST may be formed on the substrate 100, filling the first and second trenches TR1 and TR2. The device isolation layer ST may include a dielectric material, such as a silicon oxide layer. The device isolation layer ST may be recessed until upper portions of the first and second active patterns AP1 and AP2 are exposed. Thus, the upper portions of the first and second active patterns AP1 and AP2 may vertically protrude upwards from the device isolation layer ST.

Referring to FIGS. 6 and 7A to 7F, sacrificial patterns PP may be formed to run across the first and second active patterns AP1 and AP2. Each of the sacrificial patterns PP may be formed to have a linear or bar shape that extends in a first direction D1.

For example, the formation of the sacrificial patterns PP may include forming a sacrificial layer on an entire surface of the substrate 100, forming hardmask patterns MA on the sacrificial layer, and using the hardmask patterns MA as an etching mask to pattern the sacrificial layer. The sacrificial layer may include polysilicon.

A pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. The gate spacer layer may include one or more of SiCN, SiCON, and SiN. Alternatively, the gate spacer layer may be a multi-layer including one or more of SiCN, SiCON, and SiN.

First source/drain patterns SD1 may be formed on the upper portion of the first active pattern AP1. A pair of first source/drain patterns SD1 may be formed on opposite sides of each of the sacrificial patterns PP.

For example, the hardmask patterns MA and the gate spacers GS may be used as an etching mask to etch the upper portion of the first active pattern AP1, thereby forming first recessions RS1. During the etching of the upper portion of the first active pattern AP1, the device isolation layer ST may be recessed between the first active patterns AP1 (see FIG. 7C).

A selective epitaxial growth process may be performed in which an inner wall of the first recession RS1 of the first active pattern AP1 is used as a seed layer to form the first source/drain pattern SD1. The formation of the first source/drain patterns SD1 may define a first channel pattern CH1 between a pair of first source/drain patterns SD1. For example, the selective epitaxial growth process may include chemical vapor deposition (CVD) or molecular beam epitaxy (MBE). The first source/drain patterns SD1 may include a semiconductor element (e.g., SiGe) whose lattice constant is greater than that of a semiconductor element of the substrate 100. Each of the first source/drain patterns SD1 may be formed of a plurality of semiconductor layers.

For example, impurities may be in-situ implanted during the selective epitaxial growth process for the formation of the first source/drain patterns SD1. For another example, after the first source/drain patterns SD1 are formed, impurities may be implanted into the first source/drain patterns SD1. The first source/drain patterns SD1 may be doped to have a first conductivity type (e.g., p-type).

Second source/drain patterns SD2 may be formed on the upper portion of the second active pattern AP2. A pair of second source/drain patterns SD2 may be formed on opposite sides of each of the sacrificial patterns PP.

For example, the hardmask patterns MA and the gate spacers GS may be used as an etching mask to etch the upper portion of the second active pattern AP2, thereby forming second recessions RS2. A selective epitaxial growth process may be performed in which an inner wall of the second recession RS2 of the second active pattern AP2 is used as a seed layer to form the second source/drain pattern SD2. The formation of the second source/drain patterns SD2 may define a second channel pattern CH2 between a pair of second source/drain patterns SD2. For example, the second source/drain patterns SD2 may include the same semiconductor element (e.g., Si) as that of the substrate 100. The second source/drain patterns SD2 may be doped to have a second conductivity type (e.g., n-type).

Different processes may be performed to sequentially form the first source/drain patterns SD1 and the second source/drain patterns SD2. For example, the first and second source/drain patterns SD1 and SD2 may not be formed at the same time.

Referring to FIGS. 8 and 9A to 9F, a first interlayer dielectric layer 110 may be formed to cover the first and second source/drain patterns SD1 and SD2, the hardmask patterns MA, and the gate spacers GS. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be employed to planarize the first interlayer dielectric layer 110. The hardmask patterns MA may all be removed during the planarization process. As a result, the first interlayer dielectric layer 110 may have a top surface substantially coplanar with those of the sacrificial patterns PP and those of the gate spacers GS.

The sacrificial patterns PP may be replaced with corresponding gate electrodes GE. For example, the exposed sacrificial patterns PP may be selectively removed. The removal of the sacrificial patterns PP may form empty spaces. A gate dielectric pattern GI, a gate electrode GE, and a gate capping pattern GP may be formed in each of the empty spaces. The gate electrode GE may include a first metal pattern and a second metal pattern on the first metal pattern. The first metal pattern may be formed of a work function metal capable of controlling a threshold voltage of a transistor, and the second metal pattern may be formed of metal whose resistance is low.

First cutting patterns CT1 may be correspondingly formed on opposite ends of the gate electrode GE on the first logic cell LC1. Second cutting patterns CT2 may be correspondingly formed on opposite ends of the gate electrode GE on the second logic cell LC2. The second cutting pattern CT2 may be formed to have a width greater than that of the first cutting pattern CT1.

A second interlayer dielectric layer 120 may be formed on the first interlayer dielectric layer 110. The second interlayer dielectric layer 120 may include a silicon oxide layer.

A pair of separation structures DB may be formed on opposite boundaries of each of the first and second logic cells LC1 and LC2. The separation structures DB may be formed to overlap the gate electrodes GE formed on the opposite boundaries of each of the first and second logic cells LC1 and LC2. For example, the formation of the separation structure DB may include forming a hole that penetrates the first and second interlayer dielectric layers 110 and 120 and extends into the first and second patterns AP1 and AP2, and then filling the hole with a dielectric layer.

Referring back to FIGS. 2 and 3A to 3F, active contacts AC may be formed to penetrate the second and first interlayer dielectric layers 120 and 110 and to have electrical connections with the first and second source/drain patterns SD1 and SD2. Gate contacts GC may be formed to penetrate the second interlayer dielectric layer 120 and the gate capping pattern GP and to have electrical connections with the gate electrodes GE.

A third interlayer dielectric layer 130 may be formed on the second interlayer dielectric layer 120. A first metal layer M1 may be formed in the third interlayer dielectric layer 130. In example embodiments, although not shown, the first metal layer M1 may be formed on the third interlayer dielectric layer 130. For example, a first power line M1_R1 and a second power line M1_R2 may be formed. First lower lines M1_I1 may be formed based on first line tracks MTR1 of the first logic cell LC1. Second lower lines M1_I2 may be formed based on second line tracks MTR2 of the second logic cell LC2. For example, the first metal layer M1 may be formed by a single damascene process.

A fourth interlayer dielectric layer 140 may be formed on the first metal layer M1. A second metal layer M2 may be formed in the fourth interlayer dielectric layer 140. In example embodiments, although not shown, the second metal layer M2 may be formed on the fourth interlayer dielectric layer 140. The formation of the second metal layer M2 may include forming upper lines M2_I. For example, the upper lines M2_I may be formed by a dual damascene process.

Although not shown in figures, additional conductive layers may be sequentially formed in the fourth interlayer dielectric layer 140.

Figure 10:
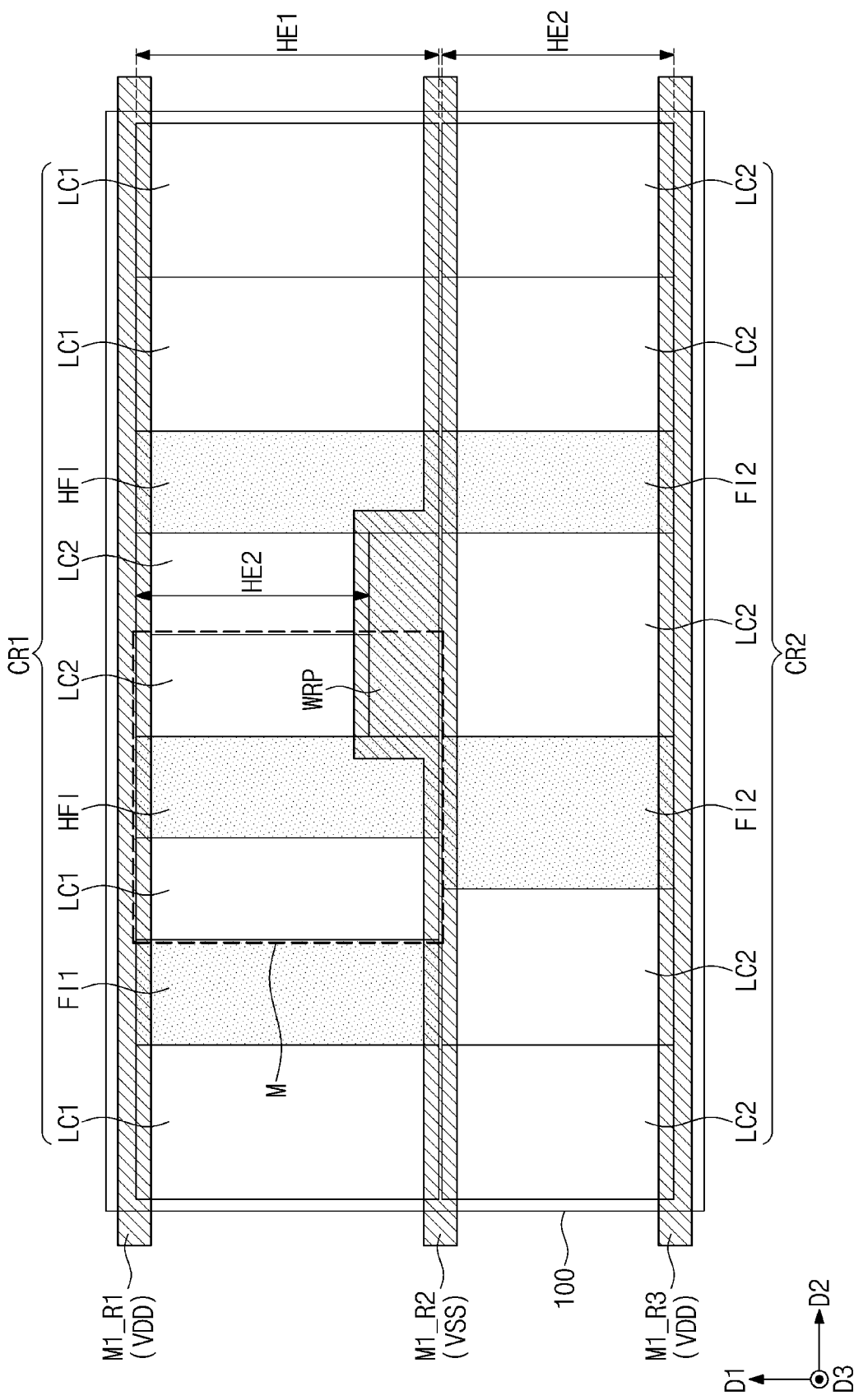
FIG. 10 illustrates a plan view showing a semiconductor device according to some example embodiments of the present inventive concepts.
Figure 11:
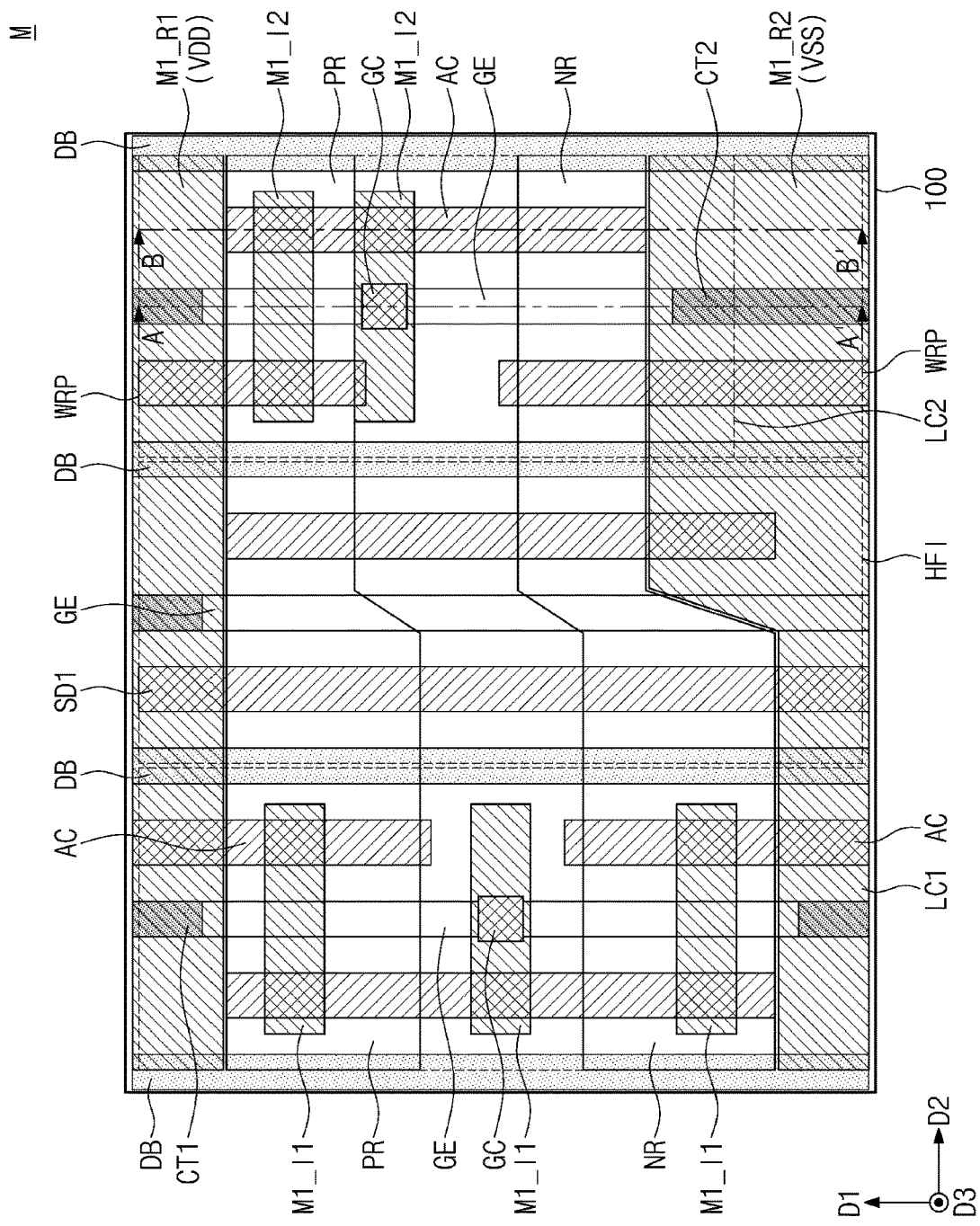
FIG. 11 illustrates a detailed plan view showing section M of FIG. 1 according to example embodiments.
Figure 12A:
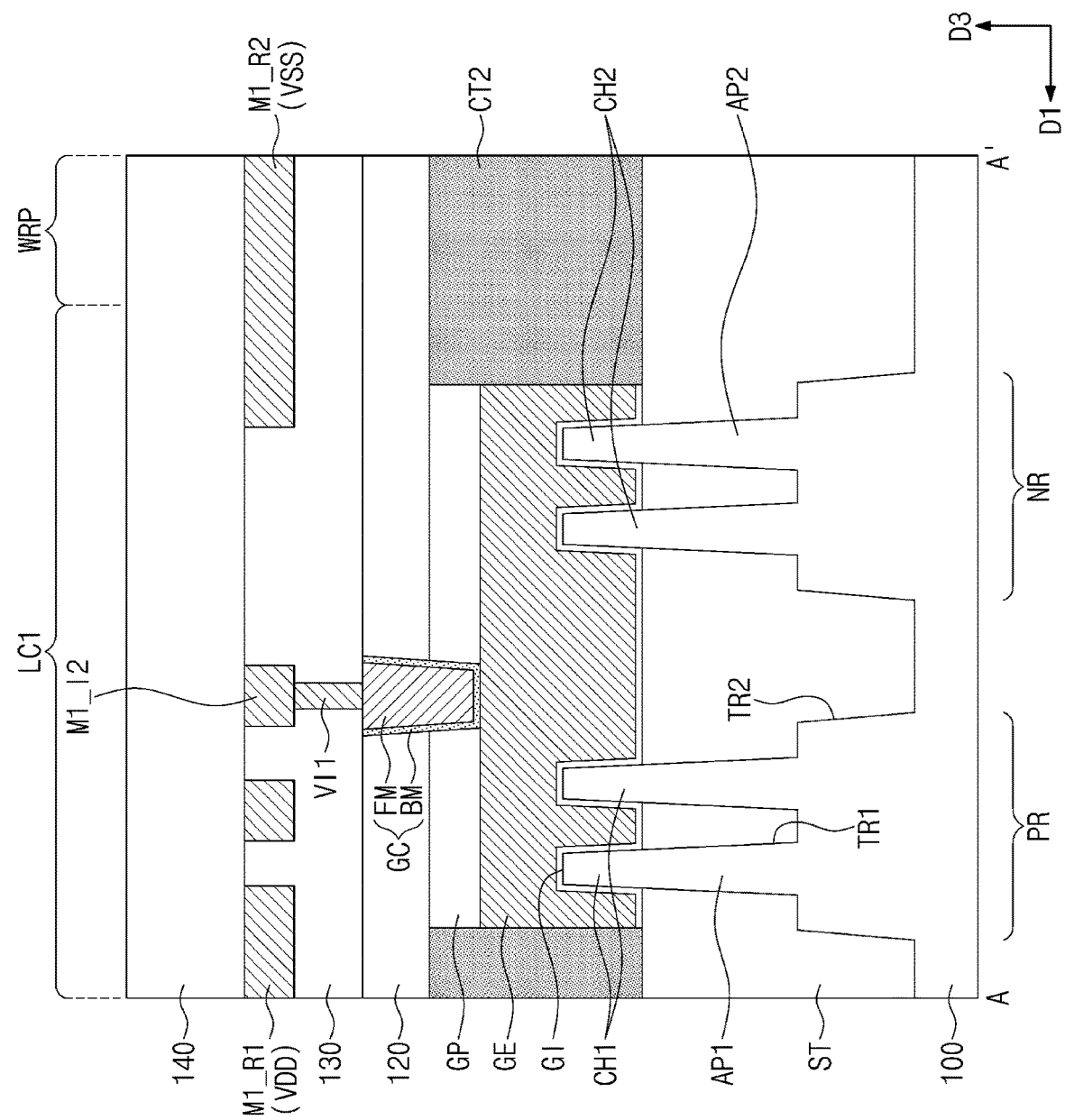
FIGS. 12A and 12B illustrate cross-sectional views respectively taken along lines A-A' and B-B' of FIG. 11 according to example embodiments.
Figure 12B:
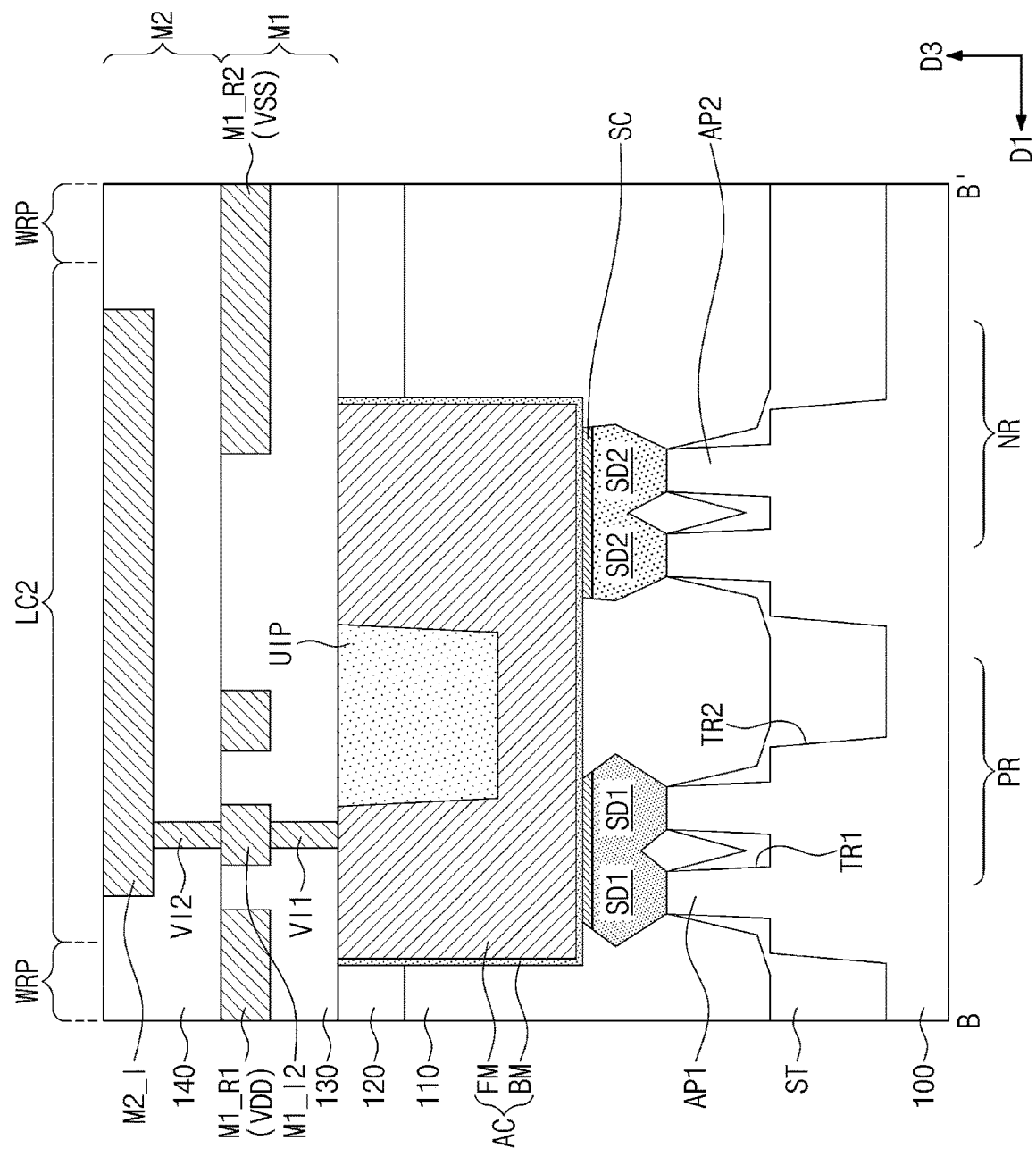

FIG. 10 illustrates a plan view showing a semiconductor device according to some example embodiments of the present inventive concepts. FIG. 11 illustrates a detailed plan view showing section M of FIG. 1. FIGS. 12A and 12B illustrate cross-sectional views respectively taken along lines A-A' and B-B' of FIG. 11. In the embodiment that follows, a detailed description of technical features repetitive to those discussed with reference to FIGS. 1, 2, 3A to 3F will be omitted, and a difference thereof will be discussed in detail.

Referring to FIG. 10, the first cell block CR1 may include a single wrapper WRP adjacent to one side of the second logic cell LC2. The wrapper WRP may be provided adjacent to the second power line M1_R2, and may allow the second power line M1_R2 to have an increased width in the first direction D1. Differently from that shown above in FIG. 1, there may be an omission of the wrapper WRP adjacent to the first power line M1_R1. Accordingly, the first power line M1_R1 may have a width that is constant without change. To allow the second logic cell LC2 to have the same cell height HE2 as the first cell height HE1, the wrapper WRP of the present embodiment may be set to have a width twice that of the wrapper WRP shown in FIG. 1.

Referring to FIGS. 11, 12A, and 12B, the second logic cell LC2 may be spaced apart in the second direction D2 from the first logic cell LC1 across the hybrid filler cell HFI. Compared to the second logic cell LC2 of FIG. 2, the second logic cell LC2 of the present embodiment may be offset in the first direction D1. Therefore, the second power line M1_R2 may have an increased width in the first direction D1. The second cutting pattern CT2 below the second power line M1_R2 may have an increased width in the first direction D1.

Figure 13:
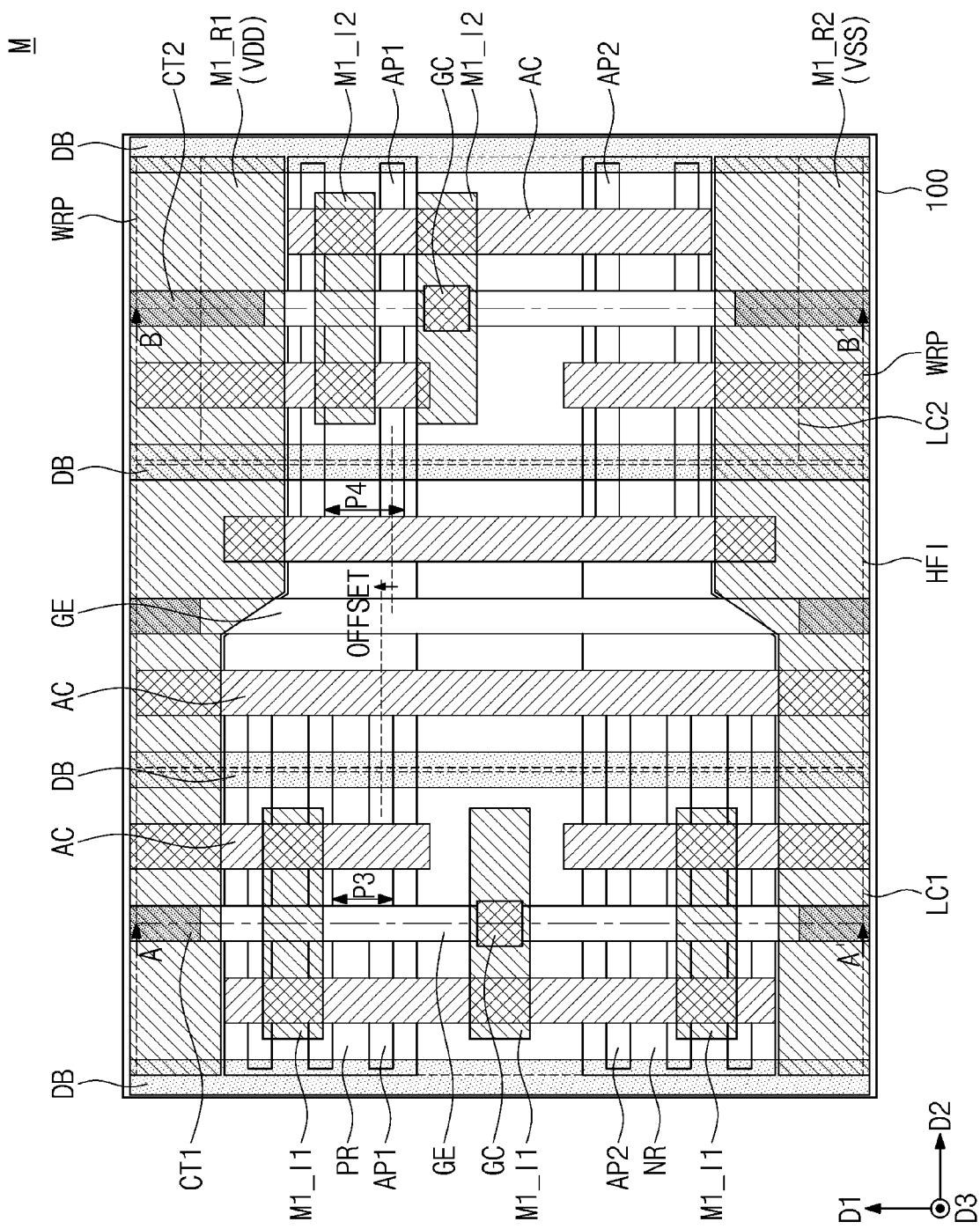
FIG. 13 illustrates a plan view of section M depicted in FIG. 1, showing a semiconductor device according to some example embodiments of the present inventive concepts.
Figure 14A:
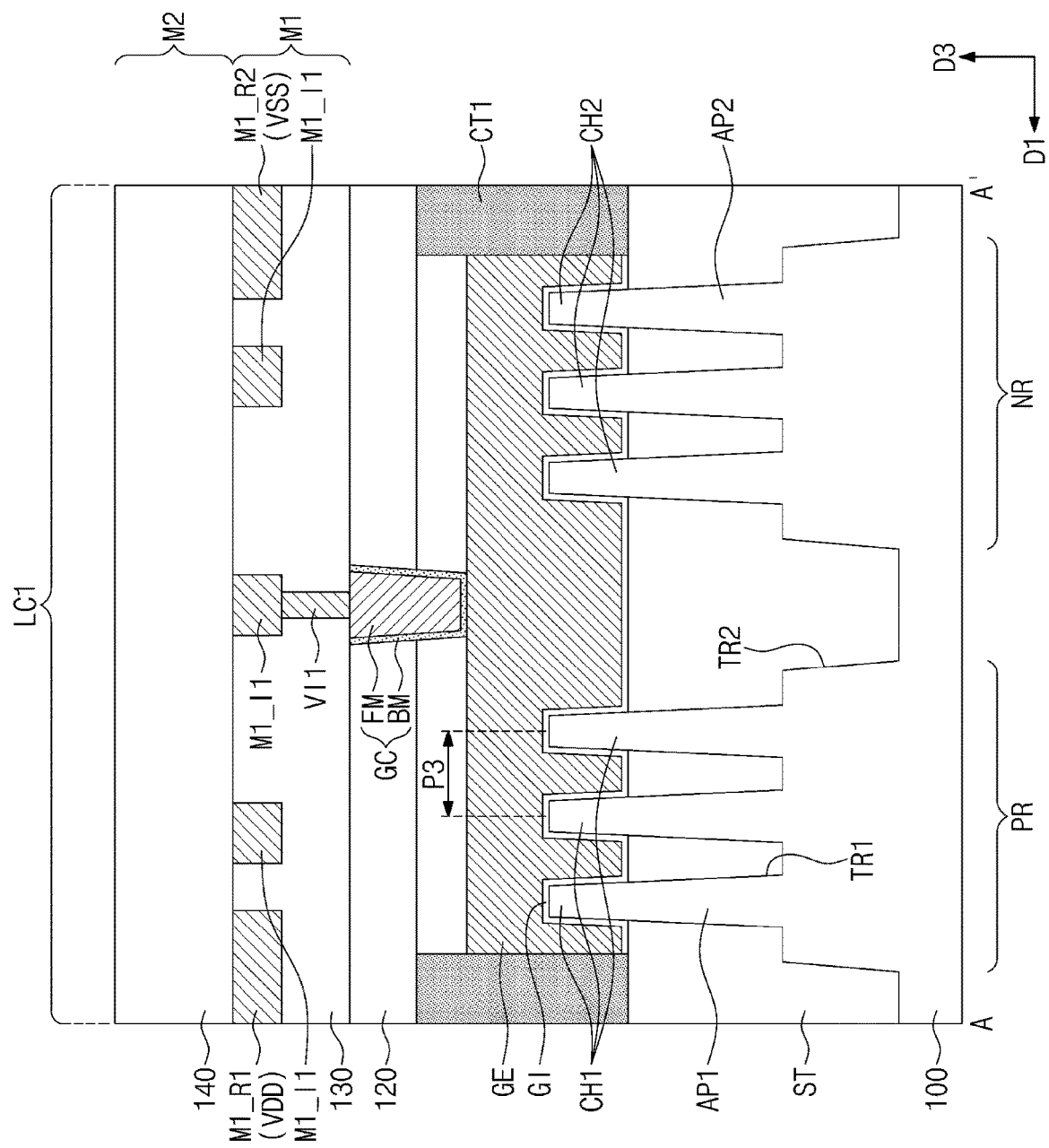
FIGS. 14A and 14B illustrate cross-sectional views respectively taken along lines A-A' and B-B' of FIG. 13 according to example embodiments.
Figure 14B:
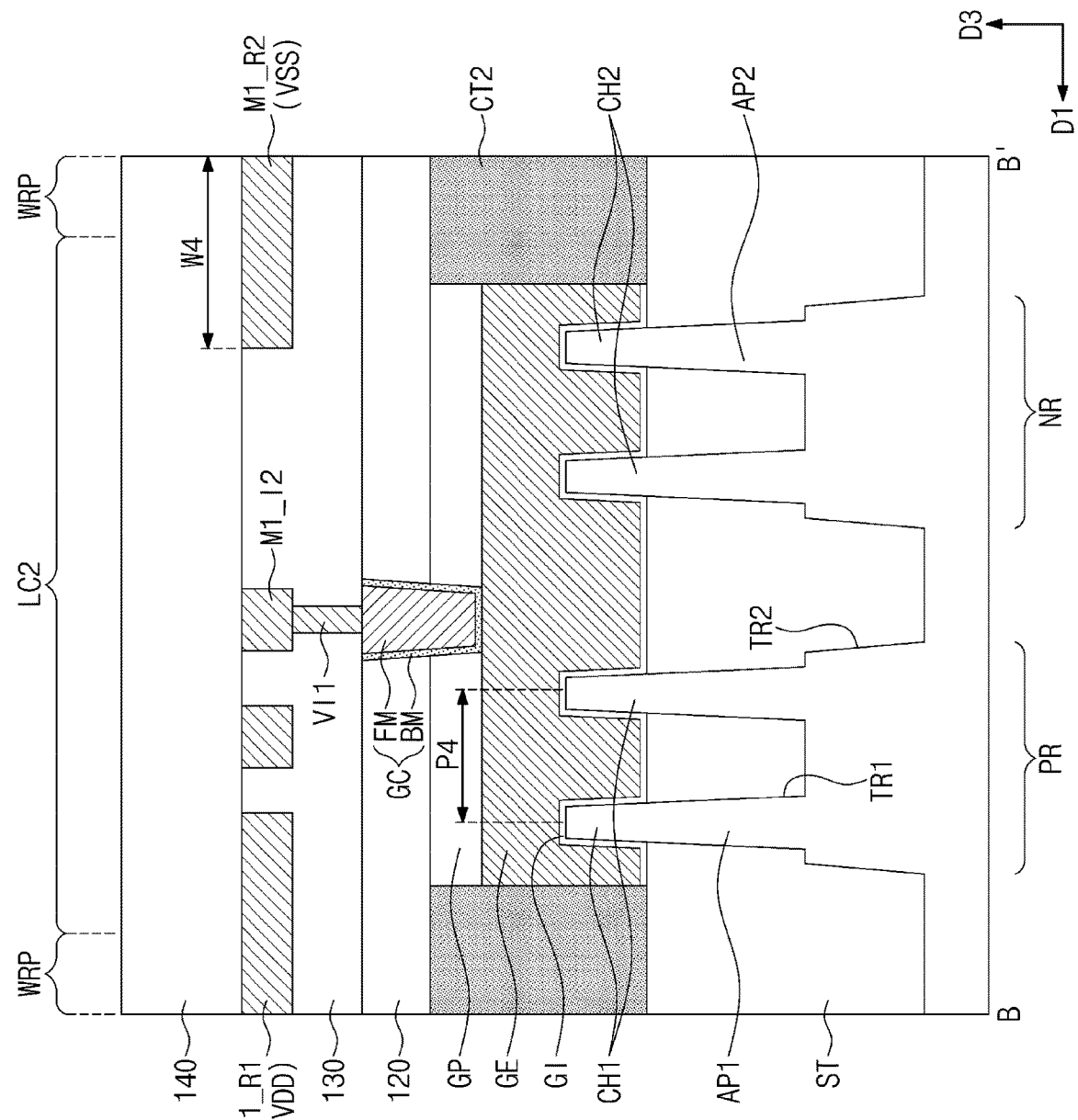

FIG. 13 illustrates a plan view of section M depicted in FIG. 1, showing a semiconductor device according to some example embodiments of the present inventive concepts. FIGS. 14A and 14B illustrate cross-sectional views respectively taken along lines A-A' and B-B' of FIG. 13. In the embodiment that follows, a detailed description of technical features repetitive to those discussed with reference to FIGS. 1, 2, 3A to 3F will be omitted, and a difference thereof will be discussed in detail.

Referring to FIGS. 13, 14A, and 14B, a third pitch P3 may be provided between the first active patterns AP1 of the first logic cell LC1. The third pitch P3 may also be provided between the second active patterns AP2 of the first logic cell LC1.

A fourth pitch P4 may be provided between the first active patterns AP1 of the second logic cell LC2. The fourth pitch P4 may be different from the third pitch P3. For example, the fourth pitch P4 may be greater than the third pitch P3. In some examples, the fourth pitch P4 may be the same as the third pitch P3. The fourth pitch P4 may also be provided between the second active patterns AP2 of the second logic cell LC2.

In some example embodiments, the first active patterns AP1 of the first logic cell LC1 may be offset in the first direction D1 from the first active patterns AP1 of the second logic cell LC2 (see FIG. 13). In conclusion, according to the present embodiment, a difference in design rule may be provided across the hybrid filler cell HFI and between active patterns of the first logic cell LC1 and active patterns of the second logic cell LC2.

Figure 15:
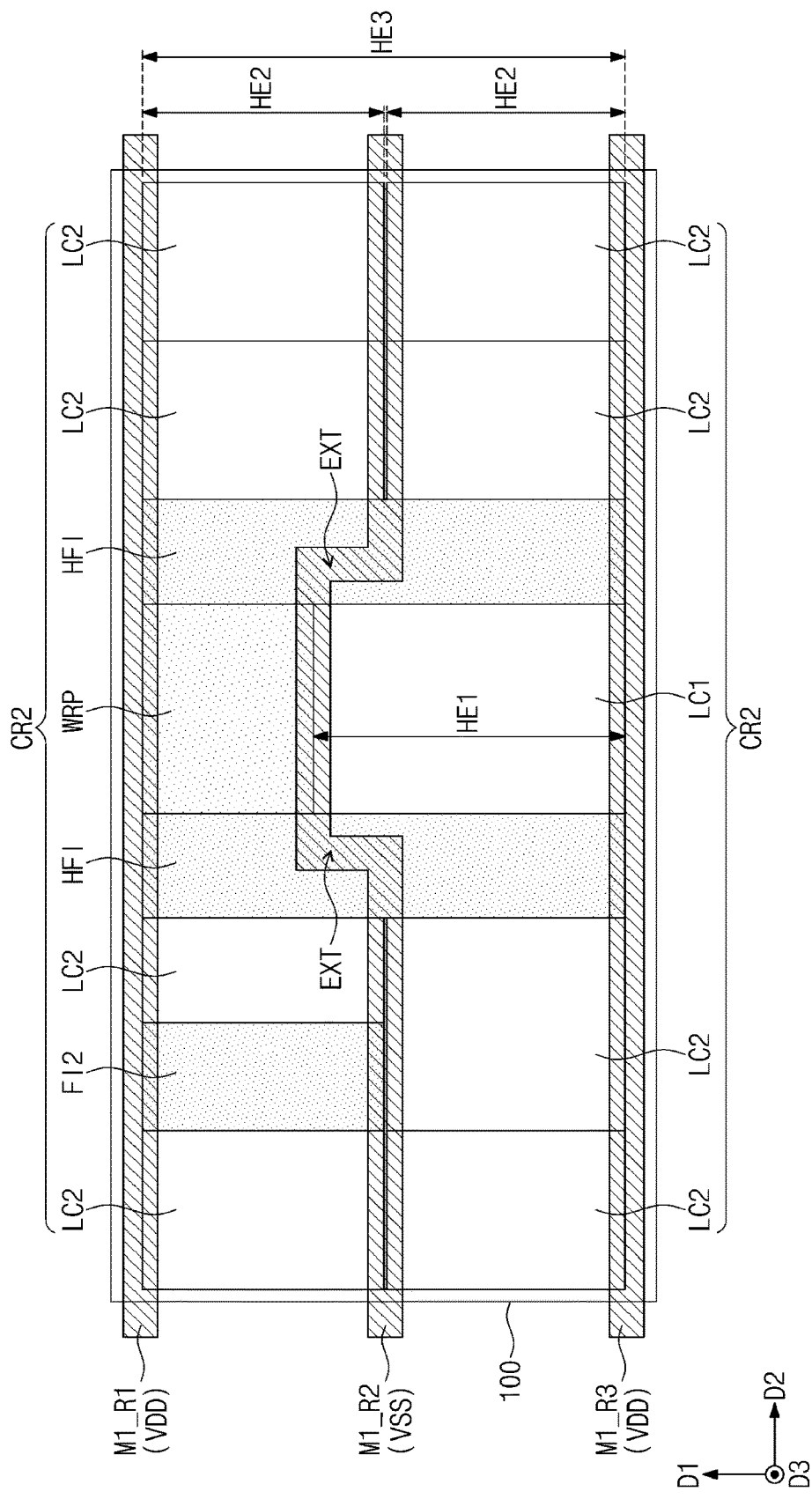
FIGS. 15 and 16 illustrate plan views showing a semiconductor device according to some example embodiments of the present inventive concepts.
Figure 16:
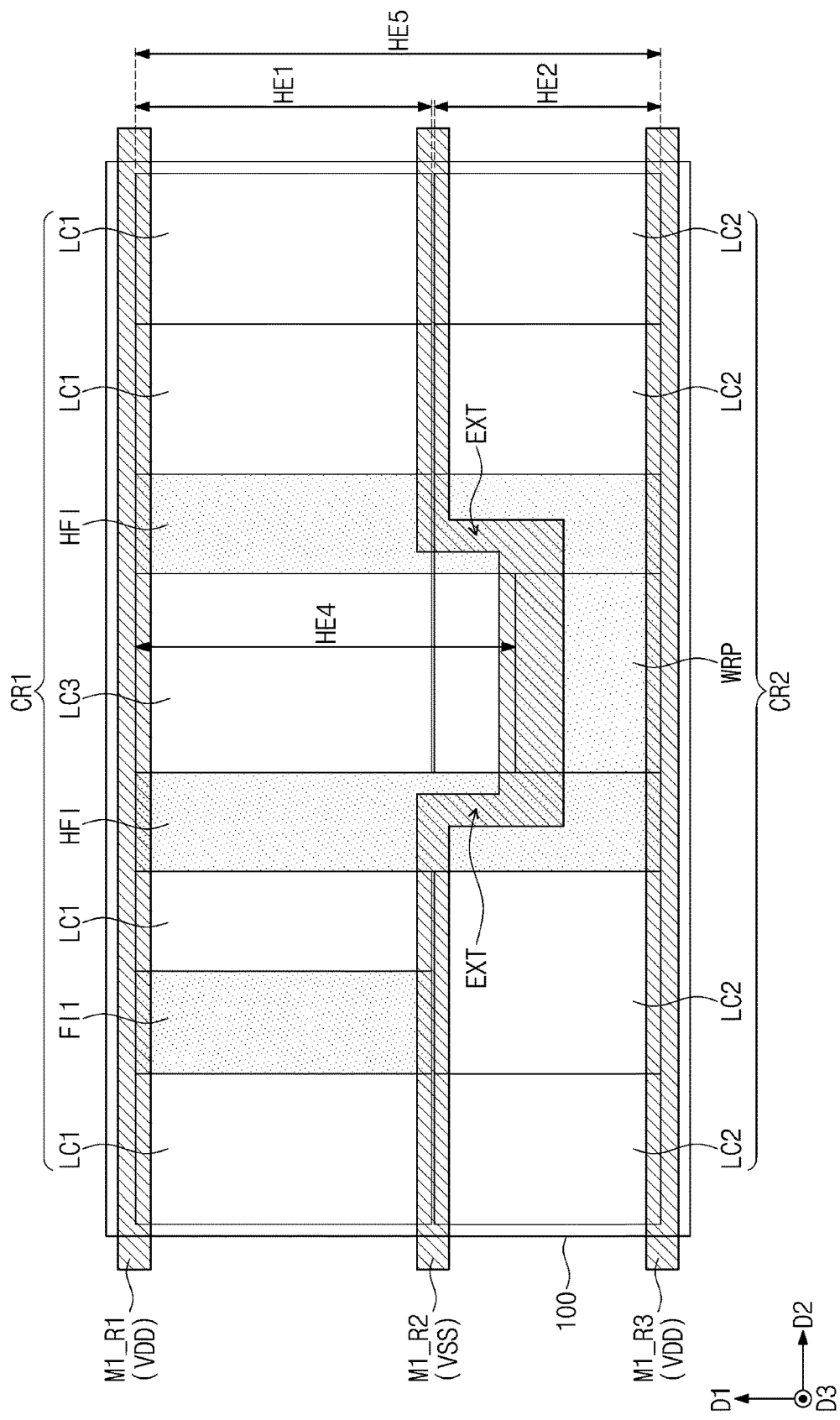

FIGS. 15 and 16 illustrate plan views showing a semiconductor device according to some example embodiments of the present inventive concepts. In the embodiment that follows, a detailed description of technical features repetitive to those discussed with reference to FIGS. 1, 2, 3A to 3F will be omitted, and a difference thereof will be discussed in detail.

Referring to FIG. 15, the second cell block CR2 may be defined between the first and second power lines M1_R1 and M1_R2, and may include the second logic cells LC2 disposed therein. The second cell block CR2 may be defined between the second and third power lines M1_R2 and M1_R3, and may include the second logic cells LC2 disposed therein. A third cell height HE3 may be provided as a sum of heights of the second cell blocks CR2 adjacent to each other in the first direction D1.

The first logic cell LC1 having the first cell height HE1 may be disposed in the second cell blocks CR2 adjacent to each other in the first direction D1. The wrapper WRP and the first logic cell LC1 may be disposed adjacent to each other in the first direction D1. A sum of heights of the wrapper WRP and the first logic cell LC1 may correspond to the third cell height HE3.

The hybrid filler cells HFI each having the third cell height HE3 may be correspondingly disposed on opposite sides of each of the first logic cell LC1 and the wrapper WRP. The hybrid filler cell HFI may solve errors caused by a difference in design rule between the first logic cell LC1 and the second logic cell LC2. In particular, according to the present embodiment, the hybrid filler cell HFI may change the position of the second power line M1_R2. For example, the hybrid filler cell HFI may include an extension EXT of the second power line M1_R2, which extension EXT may extend in the first direction D1. Therefore, the second power line M1_R2 on the first logic cell LC1 may be offset in the first direction D1 from the second power line M1_R2 on the second logic cell LC2.

According to the present embodiment, the first logic cell LC1 having a relatively large cell height may be disposed in the second cell blocks CR2 having a relatively small cell height. The wrapper WRP and the hybrid filler cell HFI may adjust differences in layout and design rule between the first logic cell LC1 and the second logic cell LC2. The first logic cell LC1 operable at high speeds may be, if needed, selectively disposed between the second logic cells LC2 integrated at high densities. Accordingly, a semiconductor device may increase in both integration and performance.

Referring to FIG. 16, the first cell block CR1 may be defined between the first and second power lines M1_R1 and M1_R2, and may include the first logic cells LC1 disposed therein. The second cell block CR2 may be defined between the second and third power lines M1_R2 and M1_R3, and may include the second logic cells LC2 disposed therein. A fifth cell height HE5 may be provided as a sum of heights of the first cell block CR1 and the second cell block CR2.

The first cell block CR1 may include a third logic cell LC3 having a fourth cell height HE4. The fourth cell height HE4 may be greater than the first cell height HE1. The wrapper WRP may be disposed between the third logic cell LC3 and the third power line M1_R3. A sum of heights of the wrapper WRP and the third logic cell LC3 may be identical to the fifth cell height HE5.

The hybrid filler cells HFI each having the fifth cell height HE5 may be correspondingly disposed on opposite sides of each of the third logic cell LC3 and the wrapper WRP. The hybrid filler cell HFI may solve errors caused by a difference in design rule between the first logic cell LC1 and the third logic cell LC3. In particular, according to the present embodiment, the hybrid filler cell HFI may change the position of the second power line M1_R2. For example, the hybrid filler cell HFI may include an extension EXT of the second power line M1_R2, which extension EXT may extend in the first direction D1. Therefore, the second power line M1_R2 on the first logic cell LC1 may be offset in the first direction D1 from the second power line M1_R2 on the third logic cell LC3.

According to the present embodiment, the third logic cell LC3 having a relatively large cell height may be disposed in the first and second cell blocks CR1 and CR2, and thus a high-speed operable cell may be, if needed, inserted between disposed cells. Accordingly, a semiconductor device may increase in both integration and performance.

FIGS. 17A, 17B, 17C, 17D, 17E, and 17F illustrate cross-sectional views respectively taken along lines A-A', B-B', C-C', D-D', E-E', and F-F' of FIG. 2, showing a semiconductor device according to some example embodiments of the present inventive concepts. In the embodiment that follows, a detailed description of technical features repetitive to those mentioned above with reference to FIGS. 2 and 3A to 3F will be omitted, and a difference thereof will be discussed in detail.

Referring to FIGS. 2 and 17A to 17F, a first active pattern AP1 and a second active pattern AP2 may be correspondingly provided on a first active region PR and a second active region NR of a substrate 100. A first trench TR1 may define the first active pattern AP1 and the second active pattern AP2. A second trench TR2 may define the first active region PR and the second active region NR. A device isolation layer ST may be provided on the substrate 100. The device isolation layer ST may fill the first and second trenches TR1 and TR2.

The first active pattern AP1 may include first channel patterns CH1 that are vertically stacked. The stacked first channel patterns CH1 may be spaced apart from each other in a third direction D3 perpendicular to the first and second directions D1 and D2. The stacked first channel patterns CH1 may vertically overlap each other. The second active pattern AP2 may include second channel patterns CH2 that are vertically stacked. The stacked second channel patterns CH2 may be spaced apart from each other in the third direction D3. The stacked second channel patterns CH2 may vertically overlap each other. The first and second channel patterns CH1 and CH2 may include one or more of silicon (Si), germanium (Ge), and silicon-germanium (SiGe).

The first active pattern AP1 may further include first source/drain patterns SD1. The stacked first channel patterns CH1 may be interposed between a pair of neighboring first source/drain patterns SD1. The stacked first channel patterns CH1 may connect the pair of neighboring first source/drain patterns SD1 to each other.

The second active pattern AP2 may further include second source/drain patterns SD2. The stacked second channel patterns CH2 may be interposed between a pair of neighboring second source/drain patterns SD2. The stacked second channel patterns CH2 may connect the pair of neighboring second source/drain patterns SD2 to each other.

Gate electrodes GE may be provided to extend lengthwise in a first direction D1, while running across the first and second channel patterns CH1 and CH2. The gate electrode GE may vertically overlap the first and second channel patterns CH1 and CH2. A pair of gate spacers GS may be disposed on opposite sidewalls of the gate electrode GE. A gate capping pattern GP may be provided on the gate electrode GE.

Figure 17A:
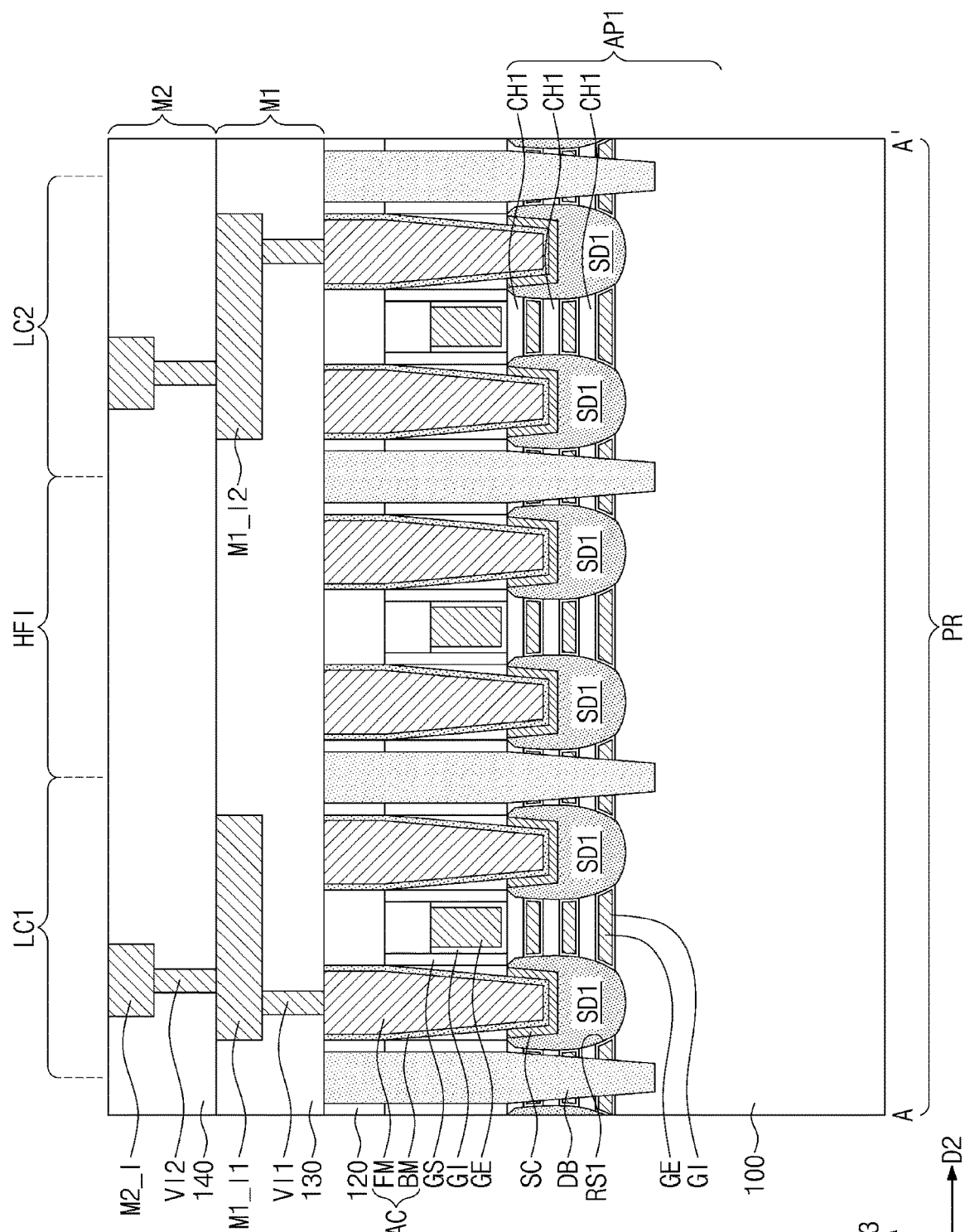
FIGS. 17A, 17B, 17C, 17D, 17E, and 17F illustrate cross-sectional views respectively taken along lines A-A', B-B', C-C', D-D', E-E', and F-F' of FIG. 2, showing a semiconductor device according to some example embodiments of the present inventive concepts.
Figure 17B:
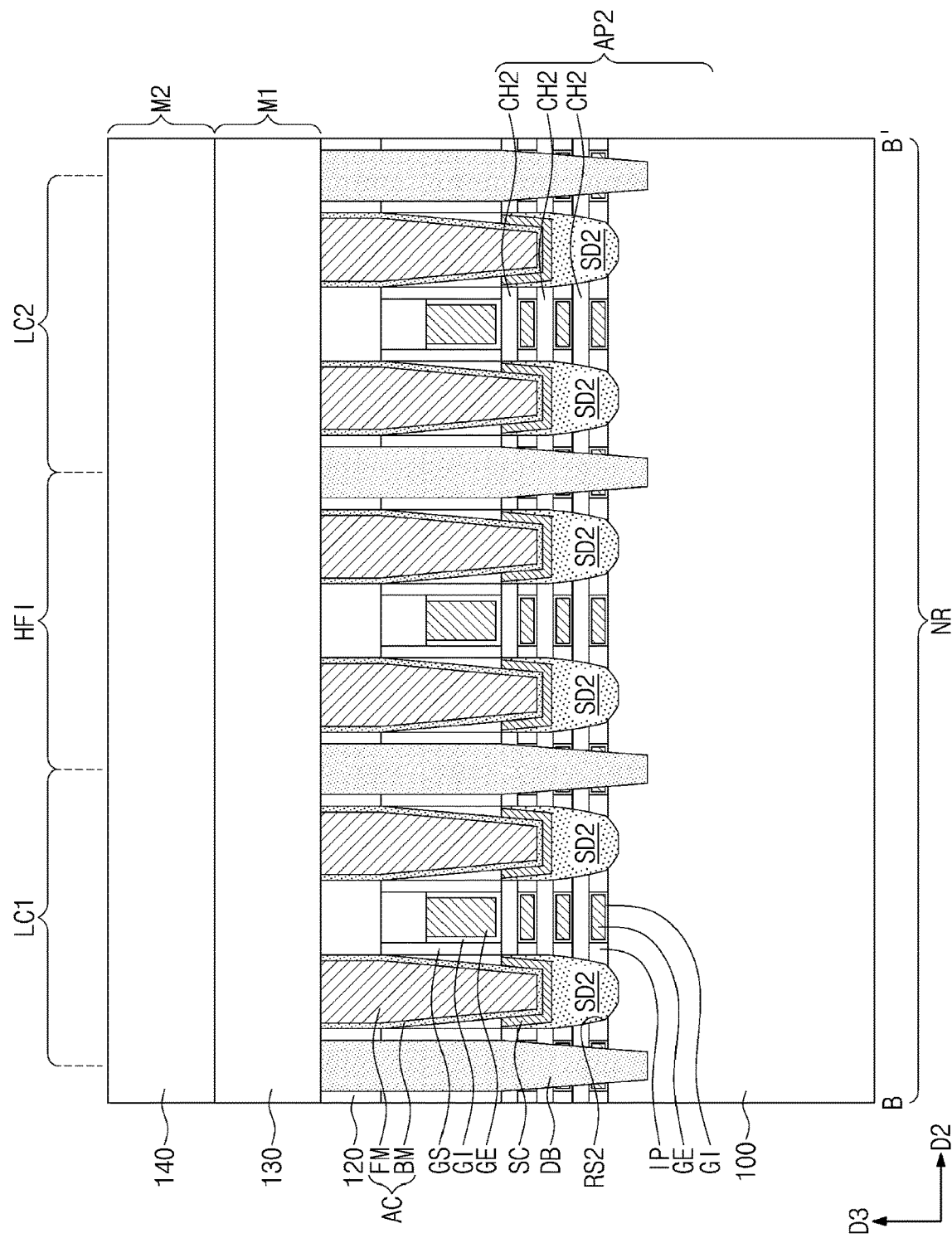
Figure 17C:
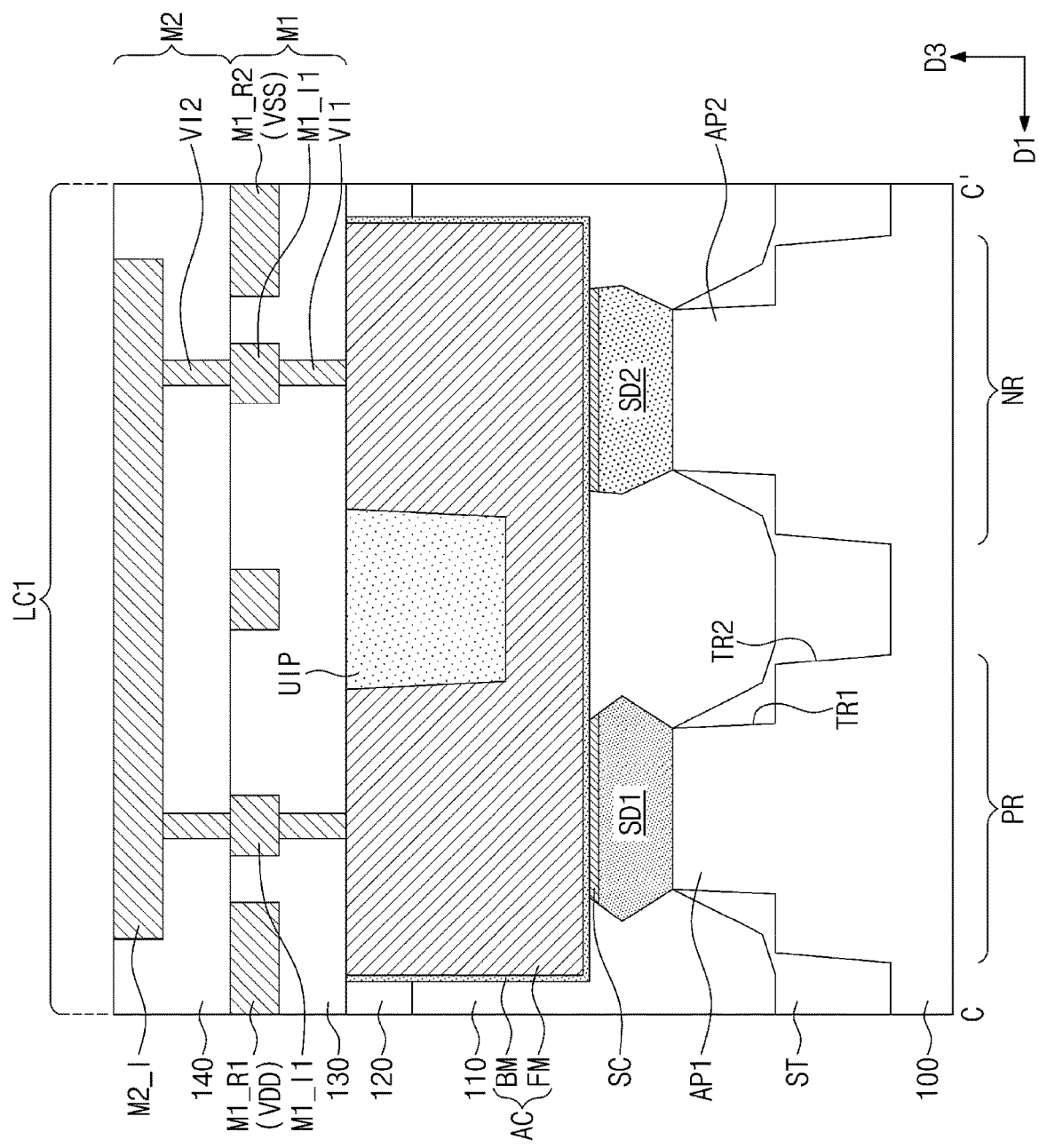
Figure 17D:
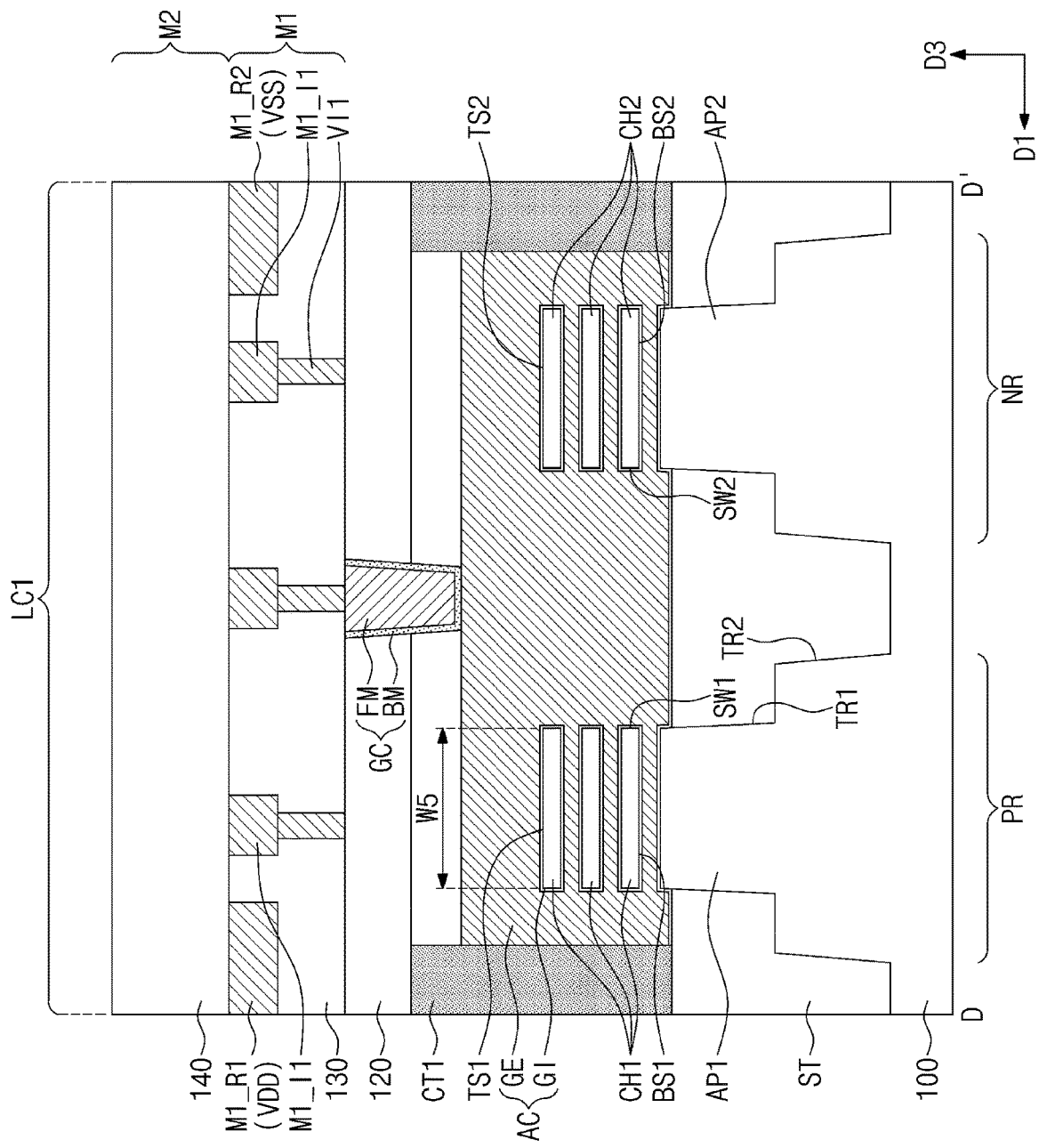

The gate electrode GE may surround each of the first and second channel patterns CH1 and CH2 (see FIG. 17D). The gate electrode GE may be provided on a first top surface TS1 of the first channel pattern CH1, at least one first sidewall SW1 of the first channel pattern CH1, and a first bottom surface BS1 of the first channel pattern CH1. The gate electrode GE may be provided on a second top surface TS2 of the second channel pattern CH2, at least one second sidewall SW2 of the second channel pattern CH2, and a second bottom surface BS2 of the second channel pattern CH2. For example, the gate electrode GE may surround a top surface, a bottom surface, and opposite sidewalls of each of the first and second channel patterns CH1 and CH2. A transistor according to the present embodiment may be a multi-bridge channel FET (MBCFET) (e.g., a three-dimensional field effect transistor (3D FET) in which the gate electrode GE three-dimensionally surrounds the first and second channel patterns CH1 and CH2.

A gate dielectric pattern GI may be provided between the gate electrode GE and each of the first and second channel patterns CH1 and CH2. The gate dielectric pattern GI may surround each of the first and second channel patterns CH1 and CH2.

On the second active region NR, a dielectric pattern IP may be interposed between the gate dielectric pattern GI and the second source/drain pattern SD2. The gate dielectric pattern GI and the dielectric pattern IP may separate the gate electrode GE from the second source/drain pattern SD2. In contrast, the dielectric pattern IP may be omitted from the first active region PR.

A first interlayer dielectric layer 110 and a second interlayer dielectric layer 120 may be provided on an entire surface of the substrate 100. Active contacts AC may be provided to penetrate the first and second interlayer dielectric layers 110 and 120 and to correspondingly have connections with the first and second source/drain patterns SD1 and SD2. Gate contacts GC may be provided to penetrate the second interlayer dielectric layer 120 and the gate capping pattern GP and to have electrical connections with the gate electrodes GE.

A third interlayer dielectric layer 130 may be provided on the second interlayer dielectric layer 120. A fourth interlayer dielectric layer 140 may be provided on the third interlayer dielectric layer 130. A first metal layer M1 may be provided in the third interlayer dielectric layer 130. A second metal layer M2 may be provided in the fourth interlayer dielectric layer 140. In example embodiments, although not shown, the first metal layer M1 and the second metal layer M2 may be respectively provided on the third and fourth interlayer dielectric layers 130 and 140. A detailed description about the first metal layer M1 and the second metal layer M2 may be substantially the same as that discussed above with reference to FIGS. 2 and 3A to 3F.

Figure 17E:
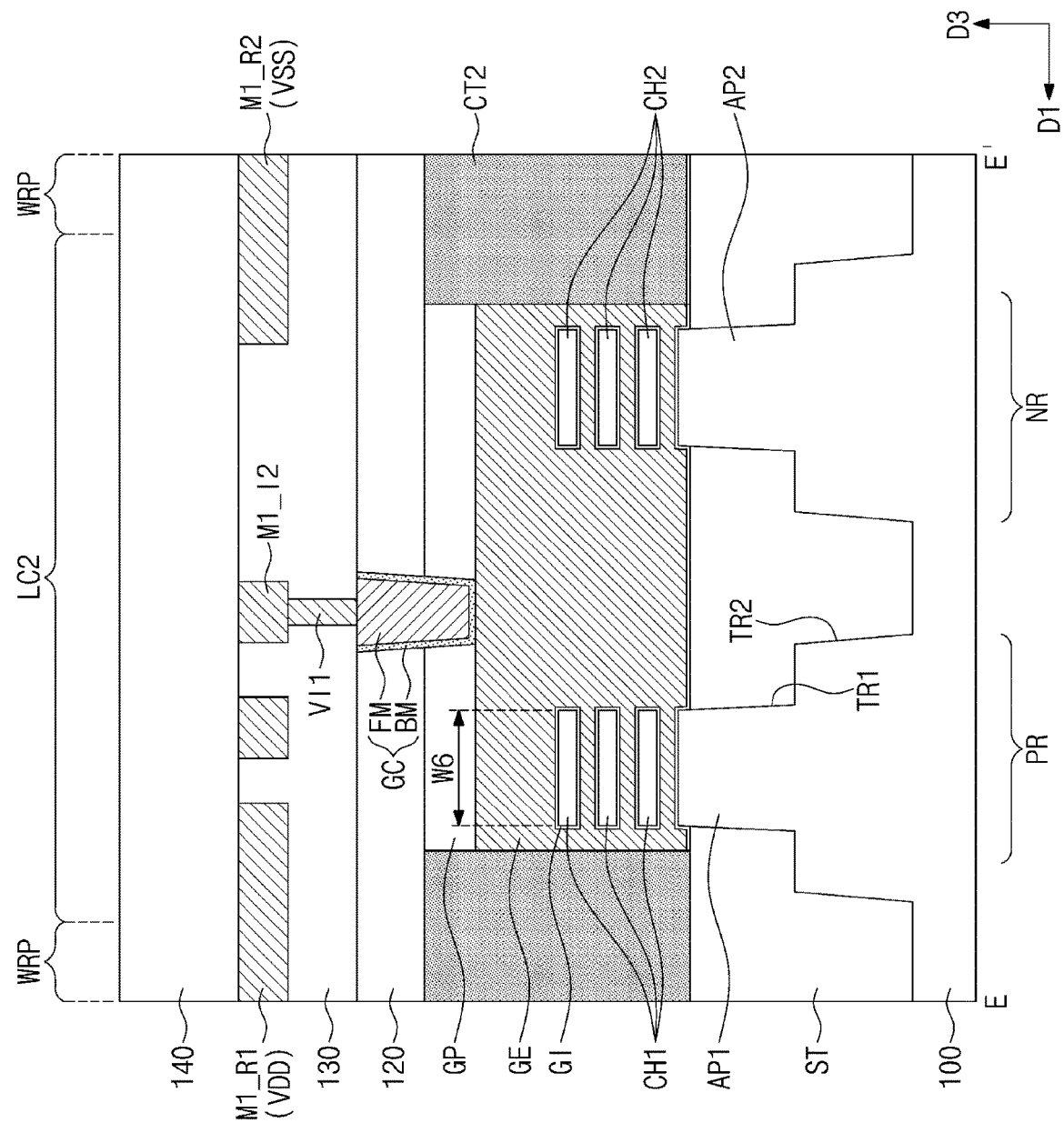

Referring to FIGS. 17D and 17E, a width in the first direction D1 of the first active region PR on the second logic cell LC2 may be less than a width in the first direction D1 of the first active region PR on the first logic cell LC1. Accordingly, a width in the first direction D1 of the first active pattern AP1 on the second logic cell LC2 may be less than a width in the first direction D1 of the first active pattern AP1 on the first logic cell LC1. For example, a fifth width W5 may be provided as a maximum width of the first channel pattern CH1 at the top of the first active pattern AP1 on the first logic cell LC1. A sixth width W6 may be provided as a maximum width of the first channel pattern CH1 at the top of the first active pattern AP1 on the second logic cell LC2. The fifth width W5 may be greater than the sixth width W6. For example, the fifth width W5 may be about 1.2 times to about 2 times the sixth width W6.

A width in the first direction D1 of the second active region NR on the second logic cell LC2 may be less than a width in the first direction D1 of the second active region NR on the first logic cell LC1. Accordingly, a width in the first direction D1 of the second active pattern AP2 on the second logic cell LC2 may be less than a width in the first direction D1 of the second active region NR on the first logic cell LC1.

Figure 17F:
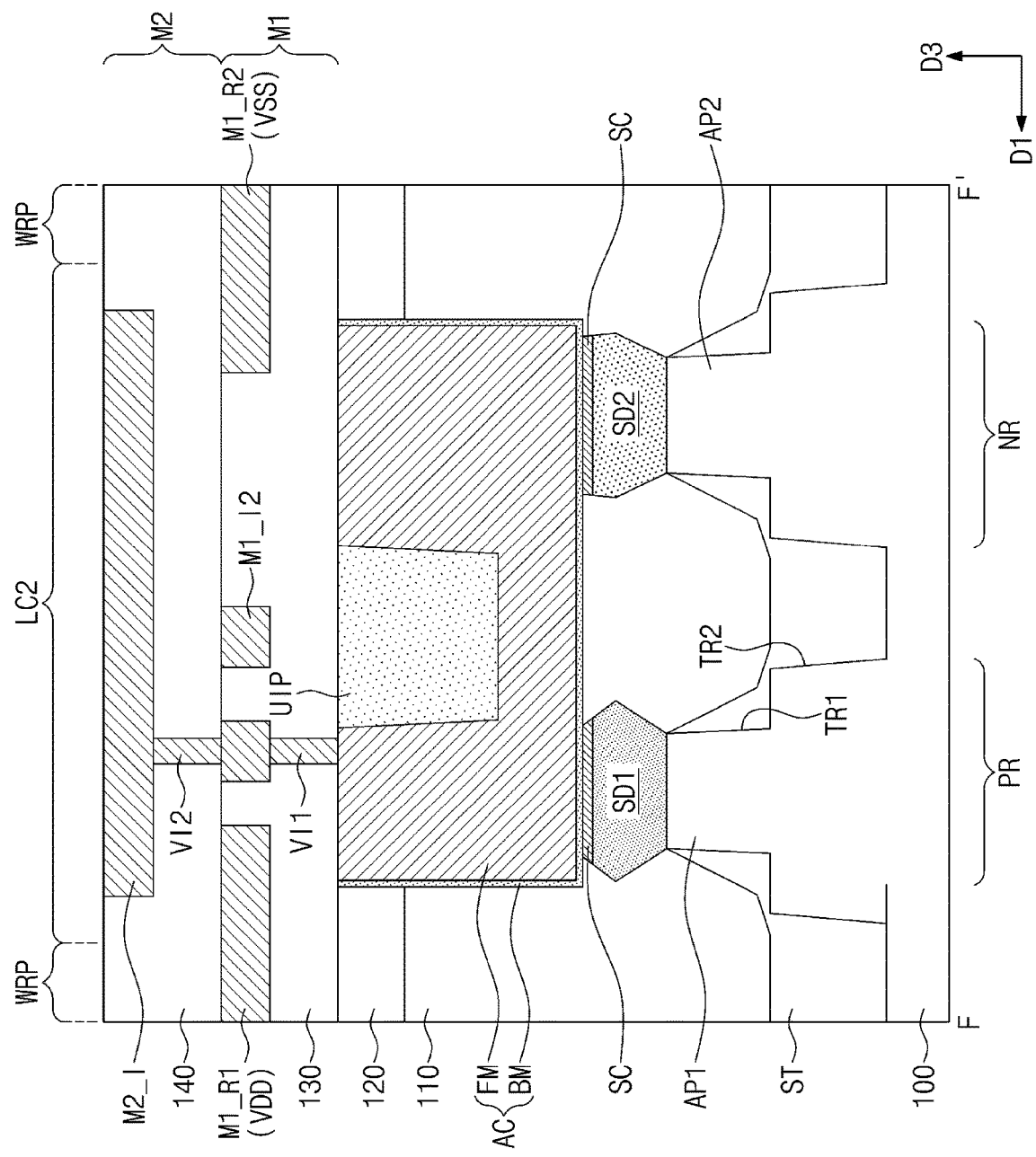

Referring to FIGS. 17C and 17F, a maximum width in the first direction D1 of the first source/drain pattern SD1 on the second logic cell LC2 may be less than a maximum width in the first direction D1 of the first source/drain pattern SD1 on the first logic cell LC1. A maximum width in the first direction D1 of the second source/drain pattern SD2 on the second logic cell LC2 may be less than a maximum width in the first direction D1 of the second source/drain pattern SD2 on the first logic cell LC1.

According to the present inventive concepts, a semiconductor device may be configured such that a logic cell having a second cell height may be disposed in a cell block having a first cell height. Therefore, the logic cell having the second cell height may be effectively disposed in an empty space present in the cell block, which may result in an increase in integration of the semiconductor device. Moreover, in the cell block, the logic cell having the second cell height may be disposed on every region that requires a high-speed operation, which may result in an effective increase in performance of the semiconductor device.

Although some example embodiments of the present inventive concepts have been discussed with reference to accompanying figures, it will be understood that various changes in form and details may be made therein without departing from the spirit and scope of the invention as set forth in the following claims.

What is claimed is:

1. A semiconductor device, comprising:
a first logic cell and a second logic cell on a substrate, wherein each of the first and second logic cells includes:
a first active region and a second active region that are adjacent to each other in a first direction;
a gate electrode that runs across the first and second active regions and extends lengthwise in the first direction; and
a first metal layer on the gate electrode,
wherein the first metal layer includes a first power line and a second power line that extend lengthwise in a second direction perpendicular to the first direction, and are parallel to each other,
wherein the first and second logic cells are adjacent to each other in the second direction along the first and second power lines,
wherein the first and second active regions extend lengthwise in the second direction from the first logic cell to the second logic cell,
wherein the first metal layer of the first logic cell further includes one or more first lower lines aligned on first line tracks between the first and second power lines,
wherein the first metal layer of the second logic cell further includes one or more second lower lines aligned on second line tracks between the first and second power lines,
wherein the first and second line tracks extend in the second direction,
wherein a distance between different sets of adjacent first line tracks of the first logic cell is the same,
wherein a distance between different sets of adjacent second line tracks of the second logic cell is the same,
wherein at least one of the first line tracks of the first logic cell is disposed at a center in the first direction of the one or more first lower lines,
wherein at least one of the second line tracks of the second logic cell is disposed at a center in the first direction of the one or more second lower lines, and
wherein the second line tracks are offset in the first direction from corresponding first line tracks, respectively.

2. The semiconductor device of claim 1, wherein each of the first and second logic cells further includes:
a first active pattern and a second active pattern on the first active region and the second active region, respectively;
a first source/drain pattern and a second source/drain pattern on an upper portion of the first active pattern and an upper portion of the second active pattern, respectively, the first and second source/drain patterns being adjacent to one side of the gate electrode;
an active contact on the first and second source/drain patterns; and
a gate contact on the gate electrode,
wherein the one or more first lower lines are electrically connected to at least one of the active contact and the gate contact on the first logic cell, and
wherein the one or more second lower lines are electrically connected to at least one of the active contact and the gate contact on the second logic cell.

3. The semiconductor device of claim 2, wherein:
the active contact of each of the first and second logic cells extends lengthwise in the first direction and electrically connects the first and second source/drain patterns to each other, and
a length in the first direction of the active contact on the first logic cell is greater than a length in the first direction of the active contact on the second logic cell.

4. The semiconductor device of claim 2, wherein the first active pattern on each of the first and second logic cells is one of a plurality of first active patterns,
wherein the number of the plurality of first active patterns on the first logic cell is greater than the number of the plurality of first active patterns on the second logic cell.

5. The semiconductor device of claim 2, wherein the first active pattern on each of the first and second logic cells includes a plurality of first channel patterns that are vertically stacked and spaced apart from each other,
wherein an uppermost one of the first channel patterns on the first logic cell has a first width in the first direction,
wherein an uppermost one of the first channel patterns on the second logic cell has a second width in the first direction, and
wherein the first width is greater than the second width.

6. The semiconductor device of claim 1, wherein each of the first and second logic cells further includes a cutting pattern on an end of the gate electrode in the first direction, and
wherein a width in the first direction of the cutting pattern on the first logic cell is greater than a width in the first direction of the cutting pattern on the second logic cell.

7. The semiconductor device of claim 1, wherein a length in the first direction of the gate electrode on the first logic cell is greater than a length in the first direction of the gate electrode on the second logic cell.

8. The semiconductor device of claim 1, wherein a width in the first direction of the first power line on the first logic cell is less than a width in the first direction of the first power line on the second logic cell.

9. The semiconductor device of claim 1, wherein a pitch between the first line tracks is substantially the same as a pitch between the second line tracks.

10. The semiconductor device of claim 1, wherein the number of the first line tracks is greater than the number of the second line tracks.

11. A semiconductor device, comprising:
a first logic cell and a second logic cell on a substrate, wherein each of the first and second logic cells includes:
a first active region and a second active region that are adjacent to each other in a first direction;
a first active pattern and a second active pattern on the first active region and the second active region, respectively;
a gate electrode that runs across the first and second active patterns and extends lengthwise in the first direction; and
a first metal layer on the gate electrode,
wherein the first metal layer includes a first power line and a second power line that extend lengthwise in a second direction perpendicular to the first direction, and are parallel to each other,
wherein the first and second logic cells are adjacent to each other in the second direction along the first and second power lines,
wherein the first and second active regions extend lengthwise in the second direction from the first logic cell to the second logic cell,
wherein the first active pattern of each of the first and second logic cells includes a plurality of first channel patterns that are vertically stacked and spaced apart from each other,
wherein an uppermost one of the first channel patterns on the first logic cell has a first width in the first direction,
wherein an uppermost one of the first channel patterns on the second logic cell has a second width in the first direction, and
wherein the first width is greater than the second width.

12. The semiconductor device of claim 11, wherein the gate electrode surrounds each of the stacked first channel patterns.

13. The semiconductor device of claim 11, wherein:
the first metal layer of the first logic cell further includes one or more first lower lines aligned on first line tracks between the first and second power lines,
the first metal layer of the second logic cell further includes one or more second lower lines aligned on second line tracks between the first and second power lines, and
the number of the first line tracks is greater than the number of the second line tracks.

14. The semiconductor device of claim 11, wherein a cell height in the first direction of the first logic cell is greater than a cell height in the first direction of the second logic cell.

15. The semiconductor device of claim 11, further comprising:
a hybrid filler cell between the first logic cell and the second logic cell,
wherein the hybrid filler cell changes a width in the first direction of at least one of the first and second active regions, and
wherein the hybrid filler cell changes a width in the first direction of at least one of the first and second power lines.

16. A semiconductor device, comprising:
a first logic cell and a second logic cell on a substrate, wherein each of the first and second logic cells includes:
a first active region and a second active region that are adjacent to each other in a first direction;
a plurality of first active fins on the first active region;
a plurality of second active fins on the second active region;
a gate electrode that runs across the first and second active fins and extends lengthwise in the first direction; and
a first metal layer on the gate electrode,
wherein the first metal layer includes a first power line and a second power line that extend lengthwise in a second direction perpendicular to the first direction, and are parallel to each other,
wherein the first and second logic cells are adjacent to each other in the second direction along the first and second power lines,
wherein the first and second active regions extend in the second direction from the first logic cell to the second logic cell,
wherein the number of the first active fins on the first logic cell is greater than the number of the first active fins on the second logic cell, and wherein a length in the first direction of the gate electrode on the first logic cell is greater than a length in the first direction of the gate electrode on the second logic cell.

17. The semiconductor device of claim 16, wherein a pitch between the first active fins of the first logic cell is different from a pitch between the first active fins of the second logic cell.

18. The semiconductor device of claim 16, wherein the first active fins of the first logic cell are offset in the first direction from corresponding first active fins of the second logic cell.

19. The semiconductor device of claim 16, wherein:
the first metal layer of the first logic cell further includes one or more first lower lines aligned on first line tracks between the first and second power lines,
the first metal layer of the second logic cell further includes one or more second lower lines aligned on second line tracks between the first and second power lines, and
the number of the first line tracks is greater than the number of the second line tracks.

20. The semiconductor device of claim 16, wherein a width in the first direction of the first power line on the first logic cell is less than a width in the first direction of the first power line on the second logic cell.

* * * * *